(12) United States Patent
Fujisawa et al.

(10) Patent No.: US 6,195,305 B1
(45) Date of Patent: Feb. 27, 2001

(54) SEMICONDUCTOR INTEGRATED CIRCUIT DEVICE

(75) Inventors: Hiroki Fujisawa, Ome; Kazuhiko Kajigaya, Iruma; Kenichi Fukui, Kodaira; Toshikazu Tachibana, Tachikawa, all of (JP)

(73) Assignees: Hitachi, Ltd, Tokyo; Hitachi Device Engineering Corp. Ltd., Mobara (JP)

( * ) Notice: Subject to any disclaimer, the term of this patent is extended or adjusted under 35 U.S.C. 154(b) by 0 days.

(21) Appl. No.: 09/288,512

(22) Filed: Apr. 8, 1999

(30) Foreign Application Priority Data

Apr. 9, 1998 (JP) ................................................. 10-114317

(51) Int. Cl.$^7$ ..................................................... G11C 7/00
(52) U.S. Cl. ........................................... 365/226; 365/227
(58) Field of Search .................................. 365/226, 227, 365/230.01

(56) References Cited

U.S. PATENT DOCUMENTS

| | | | |
|---|---|---|---|
| 5,264,743 | * 11/1993 | Nakagome et al. | 307/473 |
| 5,490,116 | * 2/1996 | Tobita et al. | 365/226 |
| 5,537,073 | * 7/1996 | Arimoto | 327/546 |
| 5,828,604 | * 10/1998 | Kawai et al. | 365/185.22 |
| 5,872,737 | * 2/1999 | Tsuruda et al. | 365/189.05 |
| 5,901,102 | * 5/1999 | Furutani | 365/226 |
| 6,031,779 | * 2/2000 | Takahashi et al. | 365/226 |

\* cited by examiner

*Primary Examiner*—Viet Q. Nguyen
(74) *Attorney, Agent, or Firm*—Antonelli, Terry, Stout & Kraus, LLP

(57) ABSTRACT

In a semiconductor integrated circuit in which an internal voltage generation circuit operating on a power supply voltage supplied through an external terminal forms either or both of a low voltage and a boosted voltage to operate internal circuits, a first internal circuit operating on the power supply voltage supplied through the external terminal or the boosted voltage formed by the internal voltage generation circuit is constituted by a first MOSFET with a gate insulation film having a large thickness adapted to the power supply voltage or boosted voltage, and a second internal circuit operating on the low voltage is constituted by a second MOSFET with a gate insulation film having a small thickness adapted to the low voltage.

16 Claims, 13 Drawing Sheets

SMOOTHED CAPACITANCE | PHASE-COMPENSATED CAPACITANCE | SMOOTHED CAPACITANCE | PHASE-COMPENSATED CAPACITANCE

⊥⊤⊥ : THICK FILM MOS
⊥⊤⊥ : THIN FILM MOS

SEMICONDUCTOR INTEGRATED CIRCUIT DEVICE

BACKGROUND OF THE INVENTION

The present invention relates to semiconductor integrated circuits, e.g., a technique advantageous for dynamic RAMs (random access memories) which are directed to higher speed and lower power consumption.

Japanese unexamined patent publication No. 8-181292 discloses an example of dynamic RAMs which a hierarchical word line configuration and a triple well structure including an N-well of a great depth.

In a dynamic RAM, a plurality of internal voltages are developed from a power supply voltage supplied through an external terminal and are supplied to internal circuit blocks. For example, a method of operating internal circuits using a voltage (3V) as a result of a voltage drop from an external power supply voltage VDD (5V) has been widely used since the advent of 16 Mbit dynamic RAMS in order to maintain the reliability of fine devices and to reduce power consumption. The 64 Mbit generation is directed to lower operating voltages in internal circuits, e.g., an external voltage VDD drops to 3.3 V to supply a low voltage on the order of 2.5 V to capacitors of memory cells, and, further, peripheral circuits are also operated at the dropped voltage.

A dynamic memory cell must be formed to have a high threshold voltage in order to prevent a reduction of information retention time attributable to a leakage current in an off state and a leak current caused by the lifting of a word line. It is desirable to reduce the operating voltage of internal circuits other than the memory cells to reduce power consumption, and the threshold voltage of MOSFETs (hereinafter, imply MISFETs according to general recognition) is preferably low in order to maintain a desired operating speed at such a low voltage.

In conventional dynamic RAMs, in order to satisfy the conflicting requirements described above, a MOSFET having a relatively high threshold voltage is formed in consideration to the information retention time at the memory cell and the operating speed of peripheral circuits as described above. The three-well structure described above electrically isolates P-type well regions where MOSFETs of memory cells are formed and P-type well regions or a substrate where MOSFETs of peripheral circuits are formed; a negative backward bias voltage is supplied to channel regions of MOSFETs that form address selection MOSFETs of memory cells to make a correction to increase a threshold voltage thereof; the ground potential of the circuit is supplied to channel regions of MOSFETs forming the peripheral circuits; and the impurity concentration of the channel regions is corrected to a lower value to make an adjustment to reduce the threshold voltage using an ion implantation technique.

SUMMARY OF THE INVENTION

The inventors have studied the possibility of a reduction in the operating voltage of a dynamic RAM provided with a mass storage capacity, e.g., 256 Mbits to 2 V or less in order to achieve a further reduction in power consumption. For an operating voltage as low as 2V or 1.8 V, the above-described technique for correcting a threshold voltage results in a problem not only in that a desired operating speed can not be achieved, but also in that process-related variations are significant. Under such circumstances, the inventors have conceived a configuration of a single semiconductor integrated circuit device utilizing MOSFETs having two kinds of gate insulation films that depend on operating voltages. The use of such MOSFETs having two kinds of gate insulation films has resulted in a new problem in that control of operations or adjustment of timing between circuits utilizing the MOSFETs having two kinds of gate insulation films requires the timing to be set based on the assumed worst case of operation timing attributable to variations in the thickness of the gate insulation films, which significantly affects the operating speed.

It is an object of the present invention to provide a semiconductor integrated circuit device in which devices can be made finer and faster with less power-consumption and without reducing reliability. It is another object of the present invention to provide a semiconductor integrated circuit device including dynamic RAMs in which devices are made finer and faster, and in which there is an improvement the degree of the integration with less power-consumption and without reducing reliability. The above-described and other objects and novel features of the present invention will become apparent from the description of the present specification and the accompanying drawings.

A typical aspect of the invention disclosed in this specification can be briefly described as follows. In a semiconductor integrated circuit device in which an internal voltage generation circuit operating on a power supply voltage supplied through an external terminal develops either or both of a dropped voltage and boosted voltage to operate internal circuits, a first internal circuit operating on the power supply voltage supplied through the external terminal or the boosted voltage developed at the internal voltage generation circuit is formed by a first MOSFET having a gate insulation film with a large thickness corresponding to the power supply voltage or the boosted voltage and a second internal circuit operating on the low voltage is formed by a second MOSFET having a gate insulation film having a small thickness corresponding to the low voltage.

Another typical aspect of the invention disclosed in the present specification can be briefly described as follows. When the second internal circuit is operated in association with the operation of the first internal circuit, an operation timing signal of the second internal circuit is formed by monitoring the state of operation of the first internal circuit by a delay circuit utilizing the first MOSFET forming a part of the first internal circuit.

DETAILED DESCRIPTION OF THE INVENTION

Figure 1:
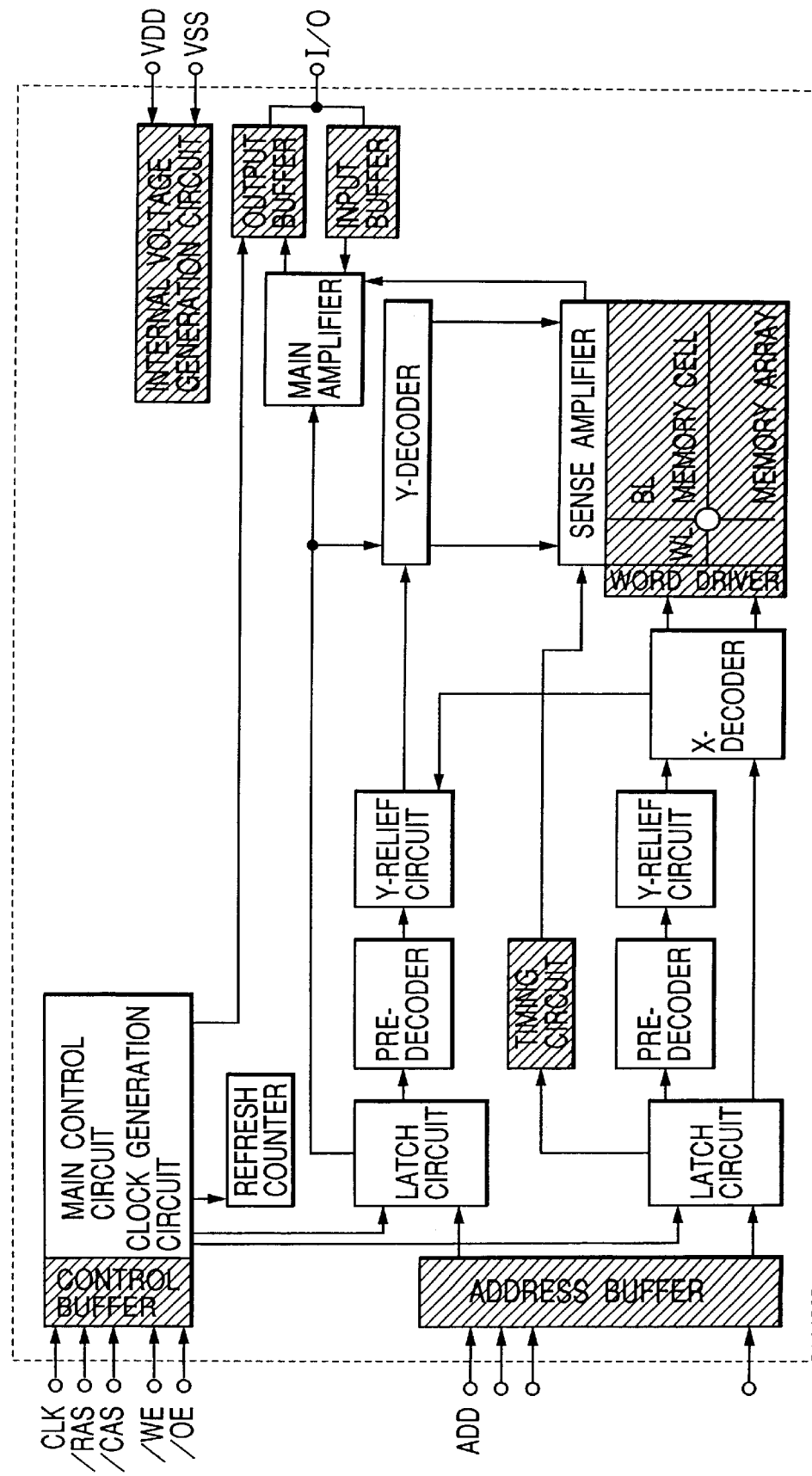
FIG. 1 is a general block diagram of an embodiment of a dynamic RAM according to the present invention.

FIG. 1 is a general block diagram of an embodiment of a dynamic RAM according to the present invention. Control input signals are a row address strobe signal /RAS, a column address strobe signal /CAS, a write enable signal /WE and an output enable signal /OE. The symbol "/" here corresponds to an over bar of a logical symbol for which the low level represents an active level. An X-address signal and a Y-address signal are input in a time series from a common address terminal Add in synchronism with the row address strobe signal /RAS and the column address strobe signal /CAS.

X-address signals and Y-address signals input through an address buffer are received by respective latch circuits. The X-address signals received by the latch circuit are supplied by a predecoder as described above, and signals output therefrom are supplied to an X-decoder to form selection signals for word lines WL. As a result of a word line selecting operation, read signals as described above appear on complementary bit lines of the memory array to cause an amplifying operation of the sense amplifier. The Y-address signals received by the latch circuit are supplied to the predecoder as described above, and signals output therefrom are supplied to the Y-decoder to form selection signals for bit lines BL. An X-relief circuit and Y-relief circuit compare an operation of storing defective addresses, the stored defective addresses and the above-described received address signals, instruct the X-decoder and Y-decoder to select spare word lines or bit lines if they match, and inhibit an operation of selecting the normal word lines or normal bit lines.

The stored information is amplified by a sense amplifier and is then selected by a column switch circuit which is not shown and the selected pieces of information are connected to common input/output lines to be transmitted to a main amplifier. There is no special particular limitation on the main amplifier, it is an amplifier which serves also as a write circuit. Specifically, it amplifies readout signals which have been read out through a Y-switch circuit and outputs them from an external terminal I/O through an output buffer during a readout operation. During a write operation, write signals input through the external terminal I/O are received through an input buffer, transmitted to a common input/output line and selected bit lines through the main amplifier. The write signals are transmitted on the selected bit lines as a result of the amplifying operation of the above-described sense amplifier, and a corresponding charge is maintained in capacitors of the memory cells.

A clock generation circuit (main control circuit) generates various timing signals required for selecting memory cells such as a fetch control timing signal for address signals input in association with the signals /RAS and /CAS and an operation timing signal for the sense amplifier. An internal power supply generation circuit receives operational voltages such as VDD and VSS supplied through a power supply terminal and generates the above-described plate voltage, an internal boosted voltage VPP, internal low voltages VDL, precharge voltages such as VDL/2 and various internal voltages such as a substrate back-bias voltage VBB. A refresh counter generates an address signal for refresh to be used for an X-system selection operation when a refresh mode is enabled.

In the present embodiment, each of the circuits with slant lines in FIG. 1 is constituted by a MOSFET having a relatively thick gate insulation film such that it is not damaged by the power supply voltage VDD or boosted voltage VPP which is the operating voltage of the same (in the present specification, the term "MOSFET" is used to incompass also an insulated gate type field effect transistor, i.e., so-called MISFET). The other circuits are constituted by a MOSFET having a relatively thin gate insulation film adapted to the low voltage VDL which is the operating voltage of the same, with some exceptions as described below.

The address buffer, a control buffer which receives the control signal, the input buffer and the output buffer are operated by the power supply voltage VDD in order to interface them with other devices operating on the system power supply voltage VDD. The internal voltage generation circuit is inevitably operated by the power supply voltage VDD because it develops the low voltage VDL, boosted voltage VPP and negative voltage VBB based on the power supply voltage VDD and ground potential VSS. The memory array (memory cells) and word drivers are operated by the boosted voltage VPP to perform a full-writing operation of capacitor charge into the memory cells as described above. Such MOSFETs operated by relatively high voltages are constituted by MOSFETs with a gate insulation film having a relatively large thickness (e.g., 8 nm) as described above. The boosted voltage VPP may be developed based on the low voltage VDL.

Each of internal circuits of the main control circuit and clock generation circuits excluding the control buffer, the refresh counter, latch circuit, predecoder, X- and Y-relief circuits, X-decoder, Y-decoder, sense amplifier and main amplifier is operated by the low voltage VDL and is accordingly constituted by a MOSFET with a gate insulation film having a relatively small thickness (e.g., 4 nm) as described above. While their operating voltage is the low voltage VDL, a timing circuit which forms a timing signal for activating the sense amplifier in accordance with a word line selecting operation is constituted by a delay circuit utilizing a MOSFET with a relatively thick gate insulation film in order to monitor the operation of the word drivers. The timing signal is one of the exceptions to the principle behind the present invention that the thickness of the gate insulation film of a MOSFET is set in relation to the operating voltage, i.e., withstand voltage of the gate insulation film as described above.

Figure 2:
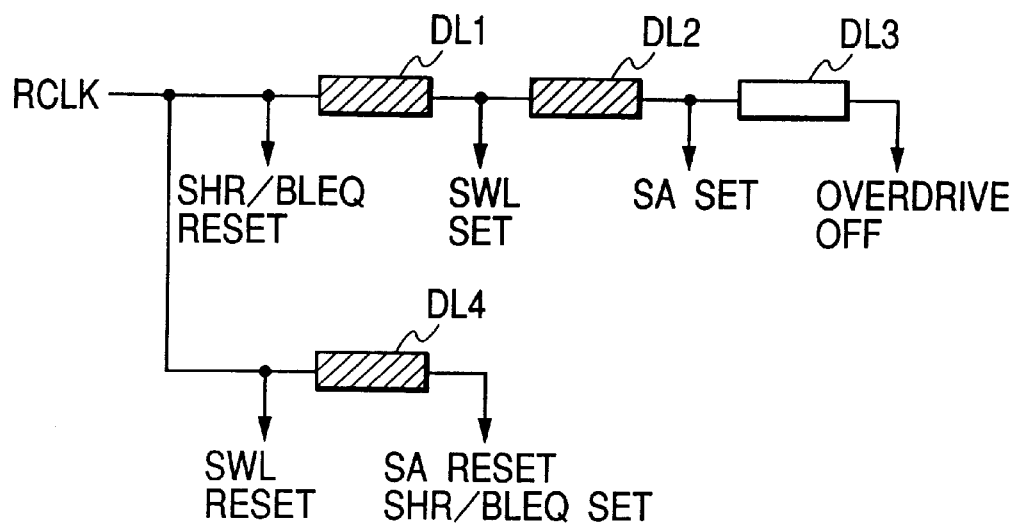
FIG. 2 is a schematic block diagram of an embodiment of the timing circuit shown in FIG. 1.

FIG. 2 is a schematic block diagram of an embodiment of the timing circuit. In the present embodiment, control signals SHR and BLEQ for a shared switch circuit and a bit line equalize circuit are set (one of the shared switches is turned off and an equalize MOSFET and a precharge MOSFET are turned off) in response to a rise of a clock signal RCLK for the row system; a sub word line SWL is set (selected) by a delay signal of a delay circuit DL1; a sense amplifier SA is set (enabled) depending on the delay time of a delay circuit DL2; and an overdrive MOSFET is turned off by a delay circuit DL3 and a switch MOSFET for supplying the low voltage VDL is turned on instead. In response to fall of the clock signal RCLK, the sub word line SWL is reset (unselected), the sense amplifier SA is reset (disabled) by a delay circuit DL4.

Since the shared switch MOSFET is switched on by the high voltage VPP applied to its gate and is switched off by a transition of the same to a low level, the delay circuit DL1 is constituted by a MOSFET with a thick gate insulation film as described above to monitor the operation of the same. Similarly, the delay circuit DL2 is also constituted by a MOSFET with a thick gate insulation film as described above to monitor a sub word line selecting operation. Specifically, the delay circuit DL2 is constituted by a MOSFET with a thick gate insulation film as described above as for the sub word driver because the sense amplifier must be operated after a period of time required to select sub word lines, to turn on the address selection MOSFETs for the selected memory cells and to establish charge sharing between charge precharged in the capacity of the bit lines and charge accumulated in the memory cell capacitors.

The delay circuit DL3 for setting the overdrive time of the sense amplifier is constituted by a MOSFET formed with a thin gate insulation film similar to that of the sense amplifier in order to monitor the operation of the sense amplifier formed with a thin gate insulation film. The sense amplifier which is disabled when the sub word lines SWL are reset and the delay circuit DL4 which sets the timing of the operation of the shared switch MOSFET and equalize MOSFET are constituted by MOSFETs having a thick gate insulation film similar to that of the sub word drivers in order to monitor the operating time of the same. When the timing circuit is constituted by a MOSFET having a thin gate insulation film similar to those of other internal circuits, it is necessary to set an extra time margin in consideration to both of the worst case possibilities associated with the longest time spent by MOSFETs having a thick gate insulation film such as those for the sub word drivers and the like and the worst case possibilities associated with the shortest time spent by the delay circuits utilizing MOSFETs having a thin gate insulation film. As a result, an unduly long operating time can be set for the sense amplifiers of most dynamic RAMs except in rare cases in which the above-described two worst cases occur. In a dynamic RAM, the operating time of the sense amplifier as described above occupies a relatively large part of the time spent before a readout signal is obtained after the input of an address corresponding thereto, and it is quite important in achieving a high speed to select word lines and activate the sense amplifier at timing as short as possible.

Figure 3:
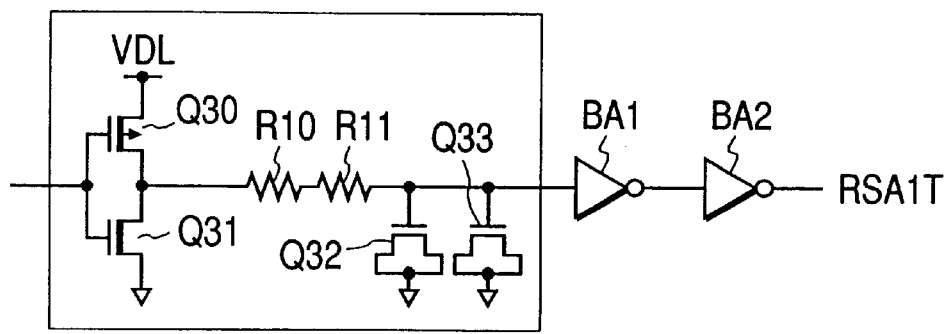
FIG. 3 is a circuit diagram of an embodiment of the delay circuit DL2 shown in FIG. 2.

FIG. 3 shows a circuit diagram of an embodiment of the delay circuit DL2. While the delay circuit DL2 is constituted by a MOSFET with a gate insulation film having the same thickness as a that of sub word drivers in order to monitor the operating time of the same as described above, it does not mean that all of the elements are constituted by a MOSFET having a thick gate insulation film. Since the delay circuit DL2 is only required to monitor the operating time of the sub word drivers as described above, it is only required to form it to have a delay time in accordance with process-related variations of MOSFETs having a thick gate insulation film. According to this principle, a MOSFET having a thick gate insulation film (hereinafter referred to as "thick film MOS") is constituted by only a P-channel type MOSFET Q30 and an N-channel type MOSFET Q31 for receiving an input signal. A time constant circuit comprising resistors R10 and R11 and capacitors utilizing the gate capacitance of MOSFETs Q32 and Q33 comprising a thin gate insulation film (hereinafter referred to as "thin film MOS") is provided at an output portion of this CMOS inverter circuit. An output timing signal RSA1T is formed through buffer circuits BA1 and BA2 which receive an output signal of the time constant circuit. Delay time at the buffer circuits is negligible relative to the overall delay time.

An ON resistance which depends on process-related variations of the MOSFETs Q30 and Q31 plays a dominant roll in determining the time constant resulting from the resistors R10 and R11 and the capacitors. Specifically, in the delay circuit DL2 of the present embodiment, the resistors R10 and R11 and the capacitors Q32 and Q33 define a constant delay time independent of process-related variations, and the ON resistance of the MOSFETs having a thick gate insulation film plays a dominant roll in setting the delay time of the word line selecting operation which depends on process-related variations.

Figure 4:
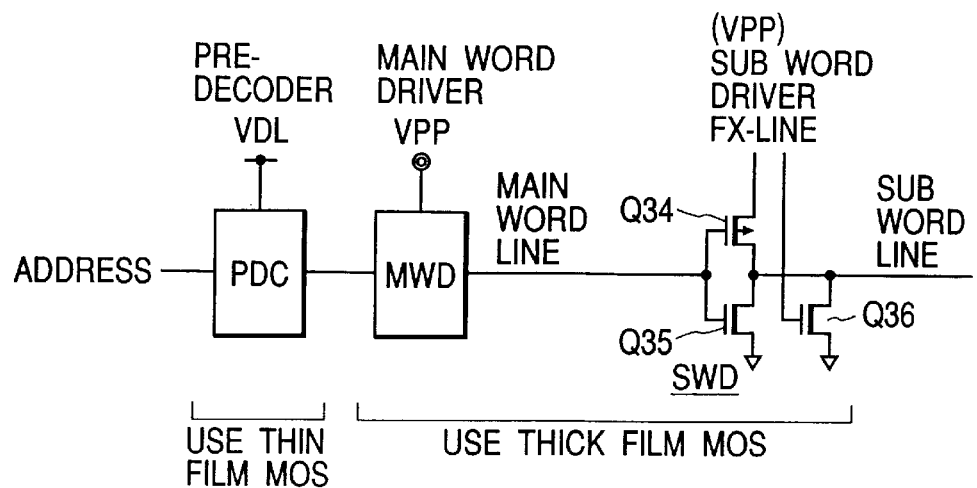
FIG. 4 is a circuit diagram of an embodiment of a sub word driver used in a dynamic RAM according to the present invention.

FIG. 4 shows a circuit diagram of an embodiment of the sub word driver. The memory array of this embodiment is a hierarchical word line system comprising main word lines and sub word lines. Although such a hierarchical word line system will be detailed later, the sub word driver receives a main word line selection signal and a sub word selection line FX to form a sub word line selection signal. Specifically, the main word lines are connected to an input terminal of an inverter circuit by a P-channel type MOSFET Q34 and an N-channel type MOSFET Q35, and the operating voltage of the same is supplied by the sub word selection lines FX. The sub word selection lines FX are also supplied to the gate of a MOSFET Q36 for resetting the sub word lines.

In order to set a selection level of the sub word line at a high voltage corresponding to the boosted voltage VPP, the selection level of the sub word selection line FX is set at a high voltage such as VPP. A non-selection level of the main word lines is set at a high voltage such as VPP. Therefore, the operating voltage of the main word driver MWD is set at VPP. A predecoder that supplies the selection signal to the main word driver MWD operates on the low voltage VDL as the operating voltage. Accordingly, a level conversion circuit for converting the VDL signal into the VPP signal is provided at an input portion of the main word driver. The predecoder operating on the low voltage VDL is constituted by a thin film MOS, and the main word driver MWD and sub word driver operating on the high voltage VPP are constituted by a thick film MOS.

The sub word driver operates as follows. When a main word line is at a selection level which is a low level; the FX line connected to the source of the P-channel type MOSFET Q34 is at a selection level at VPP; and the FX line connected to the gate of the N-channel type MOSFET Q36 is at a selection level of 0 V, the P-channel type MOSFET Q34 turns on and the N-channel type MOSFETs Q35 and Q36 are turned off to put a sub word line at a selection level such as VPP.

When a main word line is at a non-selection level which is a high level like VPP, the P-channel type MOSFET Q34 and N-channel type MOSFET Q35 turn off and on, respectively. As a result, a sub word line is put in the non-selection level even if the FX line connected to the source is at the selection level at VPP and the FX line connected to the gate of the N-channel type MOSFET Q36 is at the selection level of 0 V. Even if the main word line is at the selection level which is a low level and the P-channel type MOSFET Q34 is on, the MOSFET Q36 is turned on to put the sub word line at a non-selection level such as 0 v if the FX line connected to the source is at the non-selection level of 0 V and the FX line connected to the gate of the N-channel type MOSFET Q36 is at the non-selection level of VPP.

Figure 5:
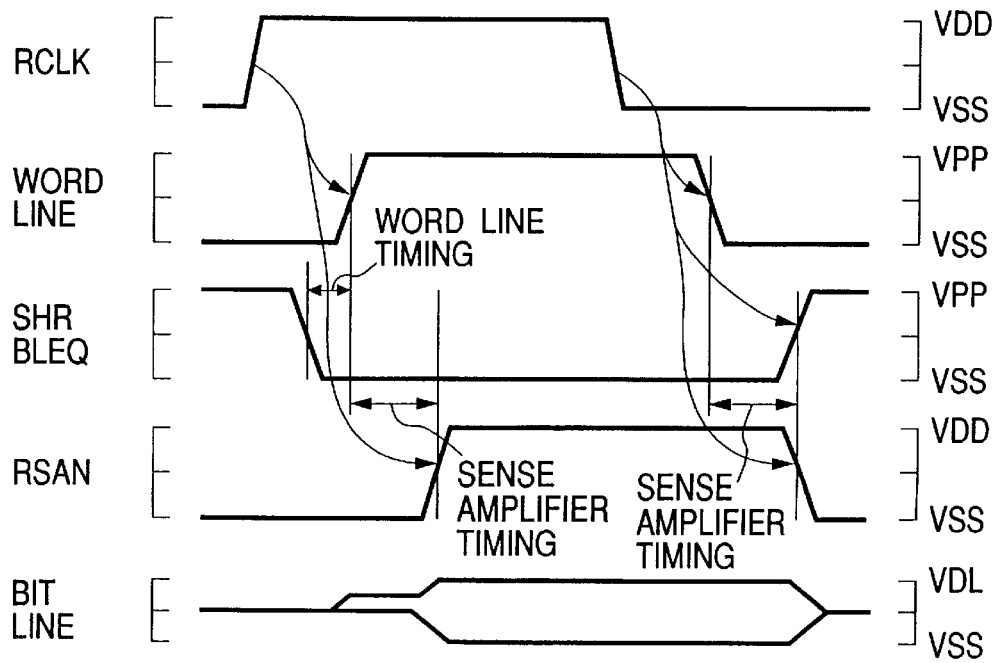
FIG. 5 is a timing chart for explaining an example of an operation to select the row system of a dynamic RAM according to the present invention.

FIG. 5 shows a timing chart for explaining an example of the above-described row system selecting operation. A rise of a clock signal RCLK toward the high level causes the shared switch control signal SHR and equalize signal BLEQ to change to the low level. As a result, the unselected bit line is disconnected from the sense amplifier, and the equalize MOSFET and precharge MOSFET are turned off.

In response to a fall of the signal RCLK, the word lines change from the low level to the selection level which is the high level. Such a word line selection operation turns on the MOSFETs of selected memory cells to cause a very small readout signal corresponding to the charge stored in the selected memory cells to appear on one of the complementary bit lines. A sense amplifier activation signal RSAN is formed after the word line selecting operation and the acquisition of the very small readout signal as a result of charge sharing between parasitic capacitance at the bit line and the capacitors of the memory cells as described above. In practice, in order to allow the sense amplifier to operate at a high speed, the sense amplifier is temporarily operated at a high voltage such as the power supply voltage VDD at the beginning of its operation.

When the clock signal RCLK falls, the word line is switched from the selection level to the non-selection level. After the word line is switched to the non-selection level, the sense amplifier activation signal RSAN is changed to a non-activated level which is a low level and the shared switch control signal SHR and equalize signal BLEQ are changed to the high level to perform half precharging (equalizing operation) of the complementary bit lines.

As described above, thick film MOSFETs are used for the delay circuits DL1, DL2 and DL4 which operate at a high voltage to provide timing for word line selection performed while monitoring the off state of the shared switch control signal SHR and equalize signal BLEQ, to provide sense amplifier timing for activating the sense amplifier depending on the timing of word line selection and to provide sense amplifier timing for non-activating the sense amplifier, which is performed while monitoring the off state of the word line. This makes it possible to set the timing on which process-related variations are reflected and to eliminate the need for setting an extra time margin. As a result, it is possible to reduce the time spent after the input of an address until the acquisition of a readout signal, in other words, to reduce the memory access time.

Figure 6:
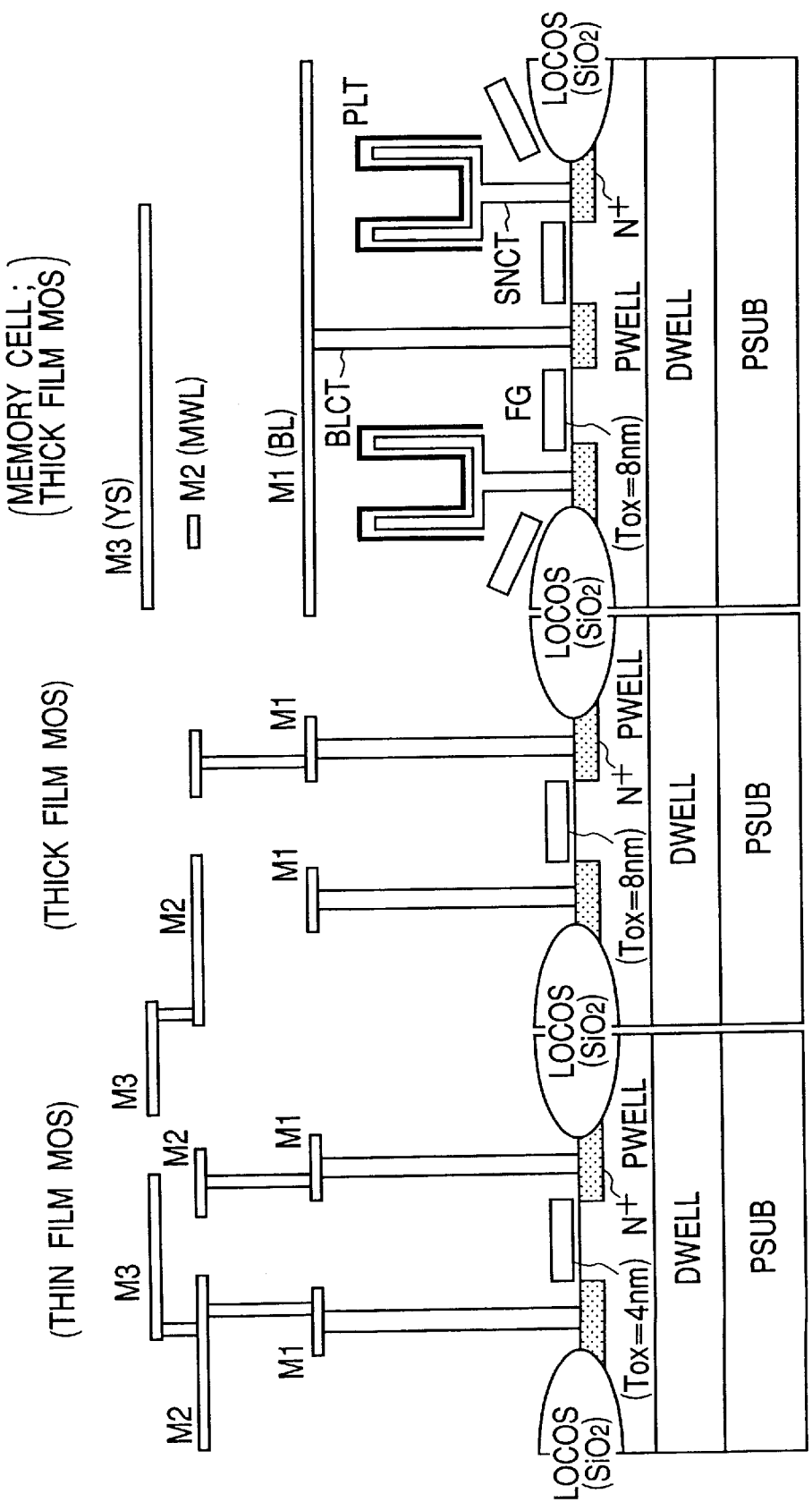
FIG. 6 is a sectional view of a device structure for explaining an embodiment of a dynamic RAM according to the present invention.

FIG. 6 shows a sectional view of a device structure for explaining an embodiment of a dynamic RAM according to the present invention. This embodiment shows a typical device structure comprising a memory cell portion, a thick film MOS and a thin film MOS as described above as an example. A storage capacitor at the memory cell utilizes a second polysilicon layer as a storage node SNCT and is connected to an N+ diffusion layer which constitutes the source and drain of one of the MOSFETs for address selection. The storage node SNCT constituted by the second polysilicon layer has a crown-shaped structure on which a plate electrode PLT constituted by a third polysilicon layer is formed with a thin gate insulation film interposed therebetween. The gate of the address selection MOSFET is integrally formed with a sub word line SWL and is constituted by a first polysilicon layer FG and tungsten silicide (WSi) formed thereon.

An N+ diffusion layer forming the source and drain of the other MOSFET for address selection is connected to a bit line BL constituted by a polysilicon layer and tungsten silicide (M1) similar to that described above provided thereon. A main word line MWL constituted by a second metal layer M2 and a sub word selection line FXB (not shown) are formed above the memory cell, and a Y-selection line YS and a sub word selection line FX constituted by a third metal layer M3 are formed on the same. The gate insulation films of the address selection MOSFETs are formed with a relatively great thickness of about 8 nm. This makes it possible to provide a withstand voltage sufficient for a selection level like the boosted voltage VPP of the sub word line SWL to which the gates are connected and to provide a relatively high threshold voltage thereby maintaining information retention characteristics.

In the present embodiment, P-type well regions PWELL in which the address selection MOSFETs are formed are electrically separated by deeper N-type well regions DWELL and are supplied with a negative back bias voltage VBB on the order of −1 V. The supply of such a negative voltage VBB also increases the threshold voltage of the address selection MOSFETs and prevents minority carriers generated in the P-type well regions PWELL from reaching the N+ diffusion layer connected to the capacitor to increase the information retention time.

The N-channel type MOSFETs having a thick gate insulation film that constitutes the sub word drivers SWD provided around the memory cell portion, the input buffer operating on the power supply voltage supplied by the external terminal and the like are formed similarly to the address selection MOSFETs of the memory cell. However, if the P-type well regions in which they are formed are separated by the DWELL, the ground potential of the circuit is supplied to them. While they are therefore formed with a gate insulation film having the same thickness as those of the MOSFETs that constitute the memory cells, they are formed to have a lower threshold voltage. The N-channel type MOSFETs that constitute the input buffer and the like formed apart from the memory array may be formed on a P-type substrate.

A first metal layer M1 is formed to provide such peripheral circuits. For example, the first metal layer M1 is used as wiring for connecting the gates of an N-channel type MOSFET and a P-channel type MOSFET having the same thick film structure which is not shown to configure the above-described CMOS inverter circuit. When the second metal layer M2 is used to connect the drains of the MOSFETs forming the CMOS inverter circuit and the like to other circuits, the connection is routed down to the first metal layer M1 as a dummy via through holes and extends to the drains through the first wiring layer M1 and contacts.

N-channel type MOSFETs having a thin gate insulation films operating on the low voltage VDL such as those for the predecoder and sense amplifier are the same as the thick film MOSFETs described above except that their gate insulation films are formed to a thickness as small as 4 nm. Referring to the method of forming two kinds of gate insulation films as described above, a thin gate insulation film is first formed; the thin gate insulation film is then removed using regions where thin film MOSs are to be formed as a mask; and a thick gate insulation film is formed thereafter. Alternatively, a gate insulation film may be formed on a thin gate insulation film as described above in an overlapping relationship to increase the thickness of the same. When a column selection switch is constituted by such a thin film MOSFET and the Y-selection line YS formed by the third metal layer M3 is connected to the gate of the column selection switch MOSFET, the connection is routed down to the metal layers M2 and M1 as a dummy as described above via a through hole and ixtends to the gate of the column switch MOSFET or to the source and drain thereof as illustrated.

With a device structure as in the present embodiment, the threshold voltage of a MOSFET operated on the low voltage VDL can be made low because it is formed with a thin gate insulation film. This makes it possible to maintain a desired operating speed because the required current can be maintained even if the low voltage VDL is reduced to a value on the order of 2 V or 1.8 V which is in the vicinity of the lower limit of the operating voltage of a CMOS circuit. At a burn-in test to be described later, the withstand voltage of a thin gate insulation film as described above can be maintained even though the low voltage VDL increases with the power supply voltage VDD because the low voltage VDL is about one-half of the power supply voltage VDD during the burn-in test.

Figure 7:
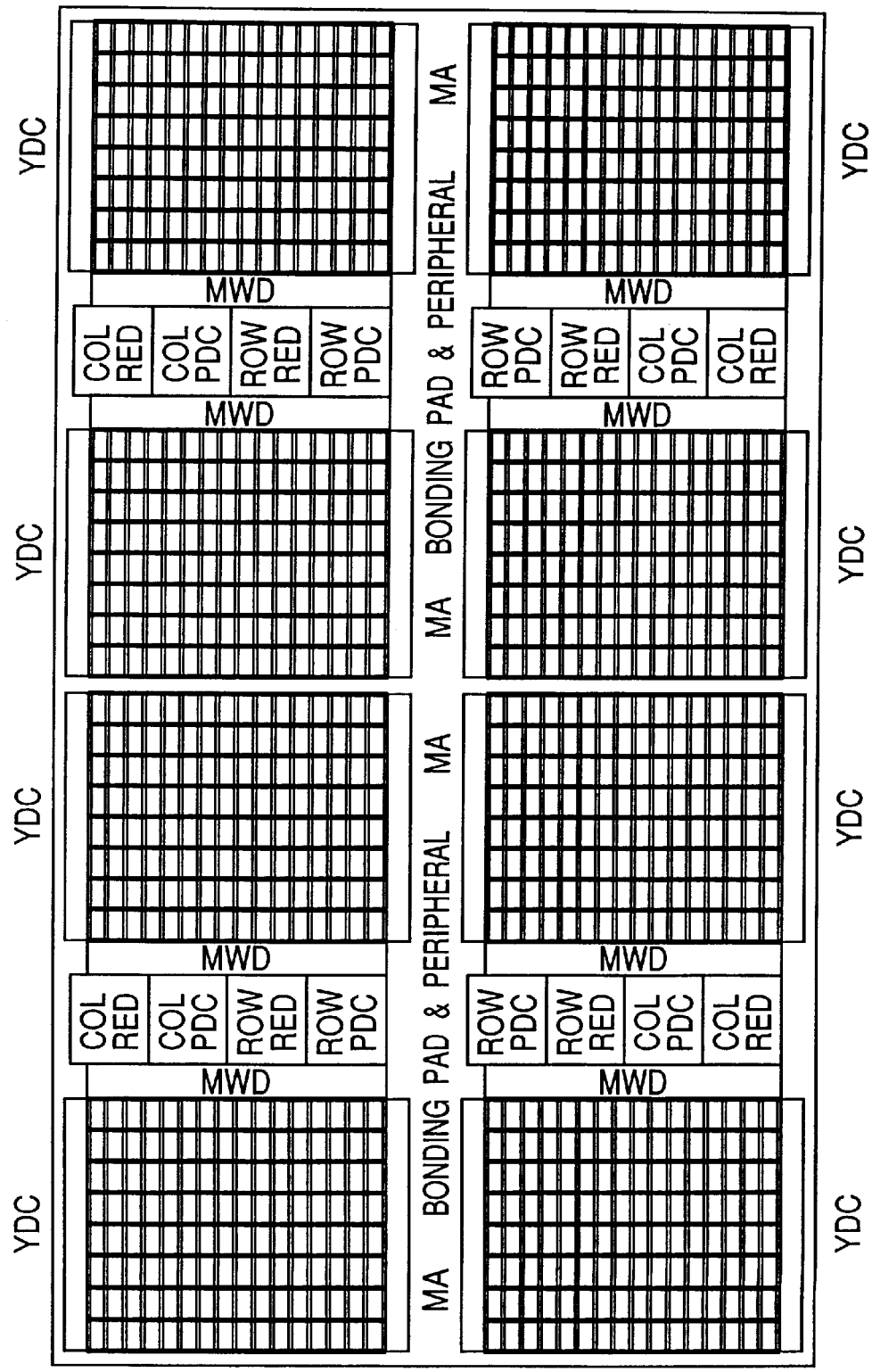
FIG. 7 is a schematic layout diagram of an embodiment of a dynamic RAM according to the present invention.

FIG. 7 illustrates a schematic layout of an embodiment of a dynamic RAM according to the present invention. FIG. 7 is an illustration which is simplified to clearly show the part of circuit blocks forming the dynamic RAM related to the present invention which are formed on a single semiconductor substrate such as single crystal silicon using a well-known technique for manufacturing semiconductor integrated circuits.

In the present embodiment, a memory array as a whole is divided into eight parts, although the invention is not limited to such an arrangement. Divided memory arrays are provided such that they are viewed as four upper and lower arrays and two each of left and right arrays in the longitudinal direction of a semiconductor chip. Peripheral circuits (peripherals) including an address input circuit, a data input/output circuit and an input/output interface circuit comprising an array of bonding pads are provided in the central region in the longitudinal direction of the chip. Main amplifiers MA are provided in the middle of the memory arrays.

A predecoder circuit ROWPDC and a relief circuit ROWRED for the X-system and a predecoder circuit COLPDC and a relief circuit COLRED for the Y-system are provided in each of the eight memory arrays in total which are divided such that they are viewed as four upper and four lower arrays and two each of left and right arrays in the longitudinal direction of a semiconductor chip in lateral middle positions as viewed in the longitudinal direction. Main word driver regions MWD are formed along the middle portions of the memory arrays such that each of them drives main word lines provided to extend vertically in association with each memory array.

In the memory arrays, Y-decoders YDC are provided on the chip periphery opposite to the central portion of the chip, although the invention is not limited thereto. In the present embodiment, the main amplifiers MA provided in the middle and the Y-decoders YDC provided on the periphery are arranged such that they sandwich the eight respective divided memory arrays. The memory array is divided into a plurality of sub arrays as will be described later. Such a sub array is formed such that it is surrounded by a sense amplifier region and a sub word driver region provided to sandwich the same. An intersection between the sense amplifier region and the sub word driver region is referred to as a "cross area". Sense amplifiers provided in the sense amplifier region are configured on a shared sense basis, and are selectively connected to either of complementary bit lines provided to the left and right of the sense amplifiers except for those provided on both ends of the memory cell arrays.

The memory cell arrays divided into four sections in the longitudinal direction of the semiconductor chip as described above are arranged in pairs. The predecoder circuit ROWPDC and relief circuit ROWRED for the X-system and the predecoder circuit COLPDC and relief circuit COLRED for the y-system are provided in the middle of two pairs of memory cell arrays. That is, memory cell arrays are arranged above and under the predecoder circuit ROWPDC and relief circuit ROWRED for the X-system and the predecoder circuit COLPDC and relief circuit COLRED for the y-system. The main word driver MWD forms a selection signal for a main word line extending in the longitudinal direction of the chip through one of the memory cell arrays. The main word driver MWD is also provided with a driver for sub word selection which forms a selection signal for a sub word selection line extending in parallel with the main word line as will be described later.

Although not shown, one subarray is formed by 512 sub word lines and 512 pairs of complementary bit lines (or data lines) perpendicular thereto. Spare word lines and complementary bit lines are provided to relieve defective word lines and defective bit lines. In one memory array, since 16 subarrays are provided in the direction in which the word lines are arranged, about 8K sub word lines are provided as a whole. Since eight subarrays are provided in the direction in which the bit lines are arranged, about 4k complementary bit lines are provided as a whole. Since eight of such memory arrays are provided in total, they provide a storage capacity as large as 8×8K×4K=256 Mbits as a whole. The length of the complementary bit lines is divided into 1/16 lengths corresponding to the 16 subarrays. The sub word lines are divided into 1/8 lengths corresponding to the eight subarrays.

A sub word driver (sub word line driving circuit) is provided for each of the subarrays as divisions of one memory array as described above. A sub word driver is divided into lengths each corresponding to 1/8 of a main word line to form a selection signal for a sub word line extending in parallel with it. In the present embodiment, in order to reduce the number of the main word lines, i.e., to increase the pitch of the main word lines, four sub word lines are provided for one main word line in the direction of the complementary bit lines, although the present invention is not limited to such an arrangement. A sub word selection driver (not shown) is provided at a main word driver MWD to select one of four sub word lines assigned in the direction of the complementary bit lines, which are divided into eight in the direction of the main word lines. Such a sub word selection driver forms a selection signal for selecting one of four sub word selection lines extending in the direction in which the sub word drivers are arranged.

When the layout shown in FIG. 7 is employed, an input Y-address is transmitted through an address buffer ADDBUP and through the relief circuit and predecoder provided in the middle of the memory array to a Y-decoder YDC provided on the periphery of the chip where a Y-selection signal is formed. The complementary bit lines of one subarray are selected according to the Y-selection signal and are transmitted to the main amplifier MA opposite thereto in the middle of the chip to be amplified and output through an output circuit which is not shown.

It seems that this configuration consumes a long time in routing a signal within the chip and outputting a readout signal. However, since an address signal must be input to the relief circuit as it is, the output time of the predecoder is determined after the result of determination on whether it is a defective address or not becomes available if the relief circuit is disposed anywhere in the middle of the chip. That is, if the predecoder and relief circuit are spaced apart, any delay of the signal between them can delay the actual Y-selection operation.

In the present embodiment, since a main amplifiers MA and a Y-decoder YDC are provided on both sides of a memory array, the sum of the transmission path of the signal for selecting the complementary bit lines of a subarray and the signal transmission path extending from the selected complementary bit lines through the input/output lines and the input of the main amplifier MA becomes a signal transmission path which extends only to traverse the memory array regardless of the complementary bit line selected. This makes it possible to halve the length of the transmission path from that of the roundtrip path described above. This allows the memory to be accessed at a higher speed.

Figure 8:
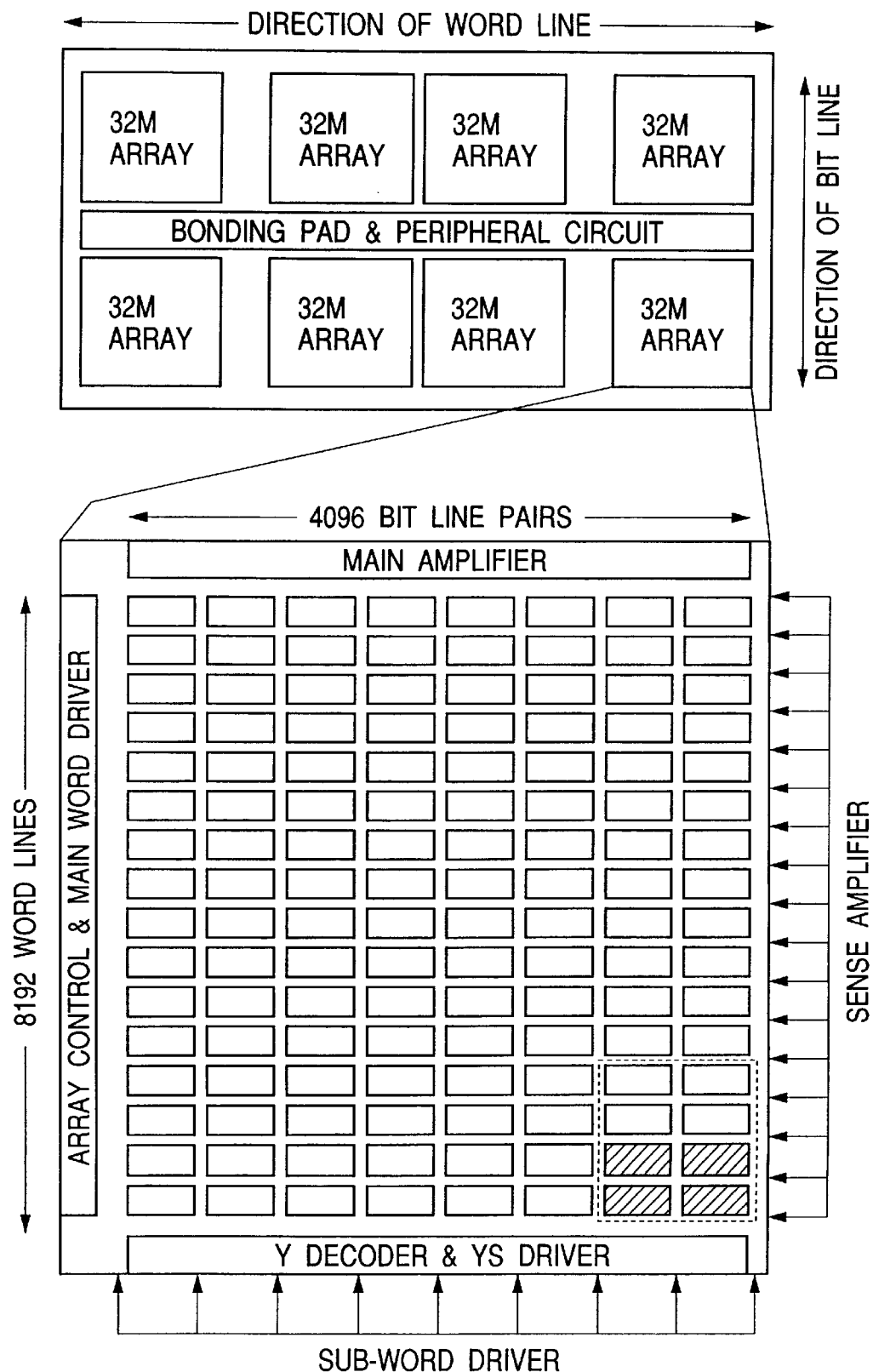
FIG. 8 is a schematic layout diagram for explaining the dynamic RAM according to the present invention in more detail.

FIG. 8 illustrates a schematic layout for explaining the dynamic RAM according to the invention in more detail. FIG. 8 shows a schematic layout of the memory chip as a whole and a layout of one of the eight divided memory arrays. FIG. 8 illustrates the embodiment in FIG. 1 from a different point of view. Specifically, as in FIG. 1, the memory chip is divided into eight memory arrays which are viewed as four each upper and four lower arrays and two each of left and right arrays in the longitudinal direction (the direction of the word lines), and a plurality of bonding pads and peripheral circuits such as input/output circuits are provided in the central region in the longitudinal direction.

Each of the eight memory arrays has a storage capacity of about 32 Mbits as described above and is divided into eight parts in the direction of the word lines and into 16 parts in the direction of the bit lines to provide subarrays one of which is shown in an enlarged view. Sense amplifiers are provided on both sides of the subarrays in the direction of the bit lines. Sub word drivers are provided on both sides of the subarrays as viewed in the direction of the word lines.

Each of the memory arrays includes 8192 word lines and 4096 pairs of complementary bit lines in total. As a result, there is a total storage capacity of about 32 Mbits. Since the 8192 word lines are divided and provided in 16 subarrays as described above, each subarray has 512 word lines (sub word lines). Since the 4096 pairs of complementary bit lines are divided and provided in eight subarrays as described above, each subarray has 512 pairs of complementary bit lines.

Main word drivers MWD are provided in association with the main word lines of the memory arrays. An array control circuit and a main word driver are provided on the left of the memory array shown in FIG. 8. The array control circuit includes drivers for driving first sub word selection lines. Main word lines are provided in the memory array such that they extend through the eight divided subarrays. The main word driver drives the main word lines. The first sub word selection lines extend through the eight divided subarrays like the main word lines. A Y-decoder and a Y-selection line driver are provided at the bottom of the array (the periphery of the chip).

Figure 9:
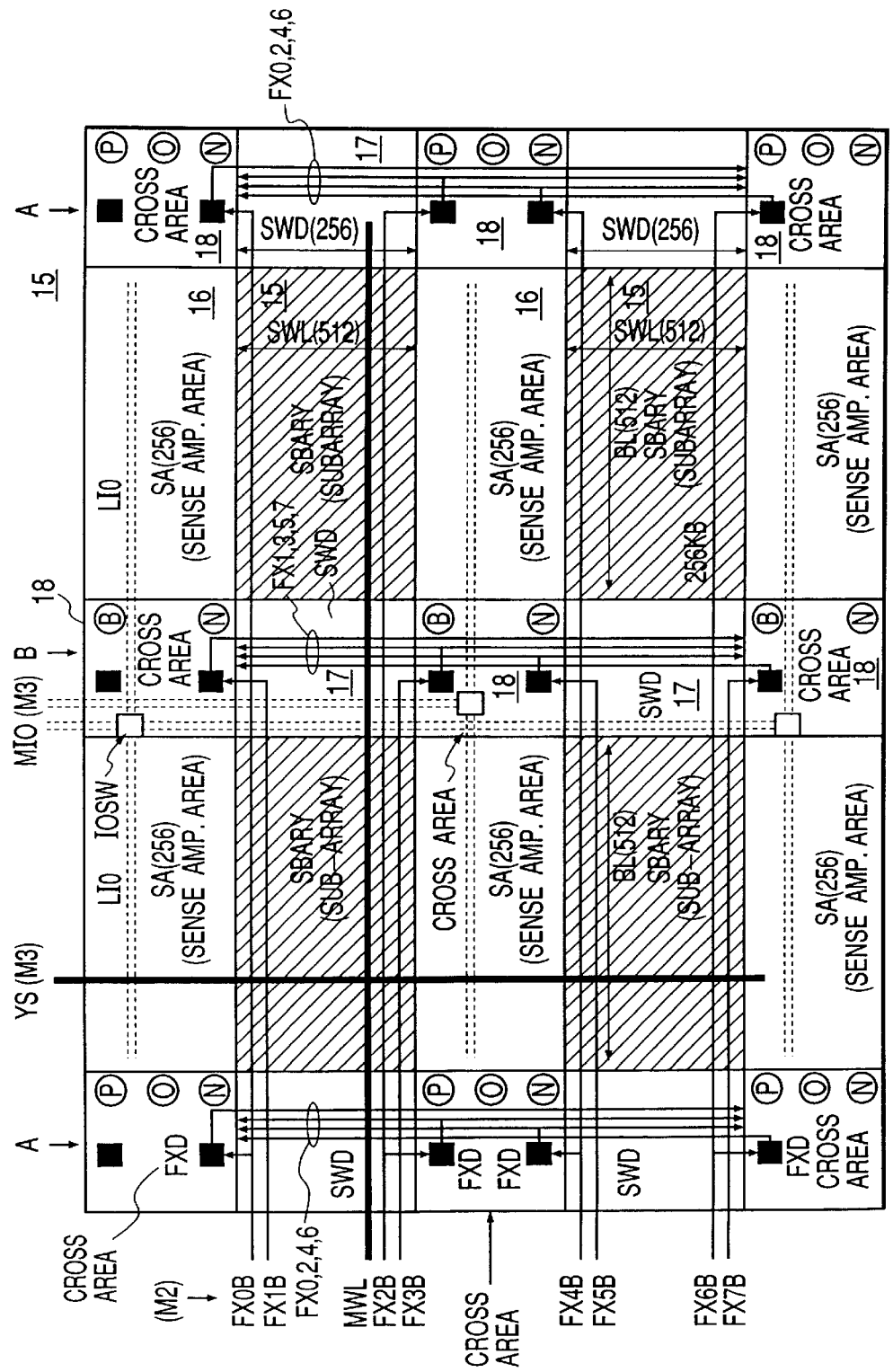
FIG. 9 is a schematic layout diagram of an embodiment of a subarray and peripheral circuits around the same in a dynamic RAM according to the present invention.

FIG. 9 illustrates a schematic layout of an embodiment of subarrays and peripheral circuits thereof in a dynamic RAM according to the invention. FIG. 9 shows four subarrays SBARY provided in the shaded position of the memory array shown in FIG. 8 as an example. In FIG. 9, the regions where the subarrays SBARY are formed are shaded to allow sub word driver regions, sense amplifier regions and cross areas provided around them to be clearly distinguished.

A subarray SBARY 15 is formed by 512 sub word lines SWL and 512 pairs of complementary bit lines arranged in the horizontal direction in which the word lines extend. Therefore, 512 sub word drivers SWD 17 associated with the 512 sub word lines SWL are provided such that they are divided into 256 lines on each of the left and right sides of such a subarray. 512 sense amplifiers SA 16 associated with the 512 pairs of complementary bit lines BL are based on the shared sense amplifier system described above and are provided such that they are divided into 256 each above and under such a subarray.

Although not shown, the subarray SBARY 15 includes auxiliary word lines in addition to the 512 regular sub word lines SWL. Therefore, the sub word drivers SWD 17 associated with the 512 sub word lines SWL and the auxiliary sub word lines are provided on the left and right sides of the subarray 15. The lower right subarray 15 comprises 512 pairs of complementary bit lines BL as described above, and 256 sense amplifiers 16 are provided above and under the same as described above. The 256 pairs of complementary bit lines formed above and under the right subarray SBARY are commonly connected to the sense amplifiers SA sandwiched therebetween through a shared switch MOSFET. Although not shown again, auxiliary bit lines are also provided and upper and lower sense amplifiers 16 are provided in association therewith.

Main word lines MWL extend as indicated by the one line illustrated as an example. Column selection lines YS extend in the vertical direction of FIG. 9 as indicated by the one line illustrated as an example. Sub word lines SWL are provided in parallel with the main word lines MWL, and complementary bit lines (not shown) are provided in parallel with the column selection lines YS. Eight sub word selection lines FX0B through FX7B extend through the four pairs of (eight) subarrays like the main word lines MWL. The group of four sub word selection lines FX0B through FX3B and the group of four sub word selection lines FX4B through FX7B extend on the upper and lower subarrays separately. The set of sub word selection lines FX0B through FX7B are assigned to two subarrays and are provided such that they extend on the subarrays in order to reduce the chip size.

If the eight sub word selection lines FX0B through FX7B are assigned to each subarray and are formed in wiring channels on the sense amplifier area, as many as 16 subarrays are provided on each of the upper and lower memory arrays to total at 32 like the memory array shown in FIG. 4, which results in a need for wiring channels in a quantity as large as 8×32=256. The present embodiment makes it possible to provide the wiring without any special wiring channel by allocating the eight sub word selection lines FX0B through FX7B to two subarrays and arranging them such that they pass through the sub arrays.

One main word line is provided for eight sub word lines on a subarray, and sub word selection lines are required to select one of the eight sub word lines. Since one main word line is formed for every eight sub word lines formed in alignment with the pitch of the memory cells, main word lines are provided at a moderate pitch. It is therefore relatively easy to form sub word selection lines between main word lines utilizing the same wiring layer on which the main word lines are provided.

Let us assume that the first sub word selection line FX0B extends in parallel with the main word line MWL. Then, a second sub word line FX0 is provided in the upper left cross area which supplies a selection signal to the upper and lower sub word drivers through a sub word selection line driving circuit FXD which receives a selection signal from the first sub word selection line FX0B. The first sub word selection line FX0B extends in parallel with the main word lines MWL and sub word lines SWL, whereas the second sub word selection line extends in parallel with the column selection lines YS and complementary bit lines BL perpendicular thereto. Unlike the eight first sub word selection lines FX0B through FX7B, second sub word selection lines FX0 through FX7 are divided into a group of even-numbered lines FX0, FX2, FX4 and FX6 and a group of odd-numbered lines FX1, FX3, FX5 and FX7 which are respectively provided at the sub word drivers SWD on the left and right sides of the subarray SBARY.

Two each of the sub word selection line driving circuits FXD as described above are provided above and under one cross area as indicated by the solid squares in FIG. 9. Specifically, the lower sub word selection line driving circuits in the upper left cross area described above are associated with the first sub word selection line FX0B; the two sub word selection line driving circuits FXD provided in the middle left cross area are associated with the first sub word selection lines FX2B and FX4B; and the upper sub word selection line driving circuits in the lower left cross area are associated with the first sub word selection line FX6B.

The lower sub word selection line driving circuits in the upper center cross area 18 are associated with the first sub word selection line FX1B; the two sub word selection line driving circuits FXD provided in the middle center cross area are associated with the first sub word selection lines FX3B and FX5B; and the upper sub word selection line driving circuits in the lower center cross area are associated with the first sub word selection line FX7B. The lower sub word selection line driving circuits in the upper right cross area are associated with the first sub word selection line FX0B; the two sub word selection line driving circuits FXD provided in the middle right cross area are associated with the first sub word selection lines FX2B and FX4B; and the upper sub word selection line driving circuits in the lower right cross area are associated with the first sub word selection line FX6B. Thus, a sub word driver provided at an end of a memory array drives only a sub word line SWL located to the left of the same because there is not a sub array to the right of the same.

Since no special wiring channel is required for the configuration of the present embodiment in which sub word selection lines are provided in the intervals between main word lines on a subarray, there will be no increase in the size of a memory chip even if eight sub word selection lines are provided on one subarray. However, the formation of sub word selection line driving circuits FXD as described above requires an increase in a chip area, which hinders improvement of the degree of integration. Specifically, there is no marginal area on the cross areas because peripheral circuits are formed thereon including switch circuits IOSW provided in association with main input/output lines MIO and sub input/output lines LIO, power MOSFETs for driving the sense amplifiers, driving circuits for driving shared switch MOSFETs and driving circuits for driving precharge MOSFETs as indicated by the dotted line in FIG. 9.

Referring to the sub word drivers, wiring is provided for the second sub word selection lines FX0 through FX6 in parallel therewith to transmit selection signals associated with the first sub word selection lines FX0B through FX6B. Since the load applied to the wiring is small as will be described later, the wiring is directly connected to the first sub word selection lines FX0B through FX6B without any separate drivers FXD as for the second sub word selection lines FX0 through FX6. The wiring layer used is the same as that for the second sub word selection lines FX0 through FX6.

In the cross areas provided in the direction A in which the even-numbered second sub word selection lines among the lines FX0 through FX6 extend, there is provided N-channel type power MOSFETs for supplying the low voltage VDL to the sense amplifiers as indicated by the circled P's, N-channel type power MOSFETs for supplying the power supply voltage VDD for overdriving to be described later to the sense amplifiers as indicated by the circled O's and N-channel type power MOSFETs for supplying the ground potential VSS of the circuits to the sense amplifiers as indicated by the circled N's.

In the cross areas provided in the direction B in which the odd-numbered second sub word selection lines among the lines FX0 through FX6 extend, there is provided N-channel type driving MOSFETs for turning off MOSFETs for precharging and equalizing the bit lines as indicated by the circled B's and N-channel type power MOSFETs for supplying the ground potential VSS of the circuits to the sense amplifiers as indicated by the circled N's. The N-channel type power MOSFETS supply the ground potential to the sources of MOSFETs for amplifying N-channel type power MOSFETs that constitute the sense amplifiers from both sides of the array of sense amplifiers. That is, the ground potential is supplied to 128 or 130 sense amplifiers provided in the sense amplifier areas by both of the N-channel type power MOSFETs provided in the cross areas indicated by A and the N-channel type power MOSFETS provided in the cross areas indicated by B.

As described above, a sub word line driving circuit SWD selects the sub word lines of the subarrays on both sides thereof. In response, the two sense amplifiers associated with the sub word lines of the two selected subarrays are activated. This is necessary because a rewriting operation is required in which the sense amplifiers are activated to recover the initial state of the charge at the storage capacitors which has been combined with the charge on the bit lines when the sub word lines have been selected to turn on the address selection MOSFETS. For this reason, the power MOSFETs indicated by P, O and N are used to activate the sense amplifiers on both sides thereof except those associated with the subarrays located at the edge. The sub word line driving circuit SWD provided on the right side of the subarrays at the edge of a memory array selects only the sub word lines of such subarrays, the power MOSFETs indicated by the P, O and N activate only the sense amplifiers associated with those subarrays.

The sense amplifier is based on the shared sense system and performs a rewrite operation in which shared switch MOSFETs associated with the complementary bit lines of one of the subarrays on both sides thereof whose sub word lines have been unselected are turned off and disconnected to allow readout signals on the complementary bit lines associated with the selected sub word lines to be amplified and to return the storage capacitors of the memory cells to the initial state of charge.

Figure 10:
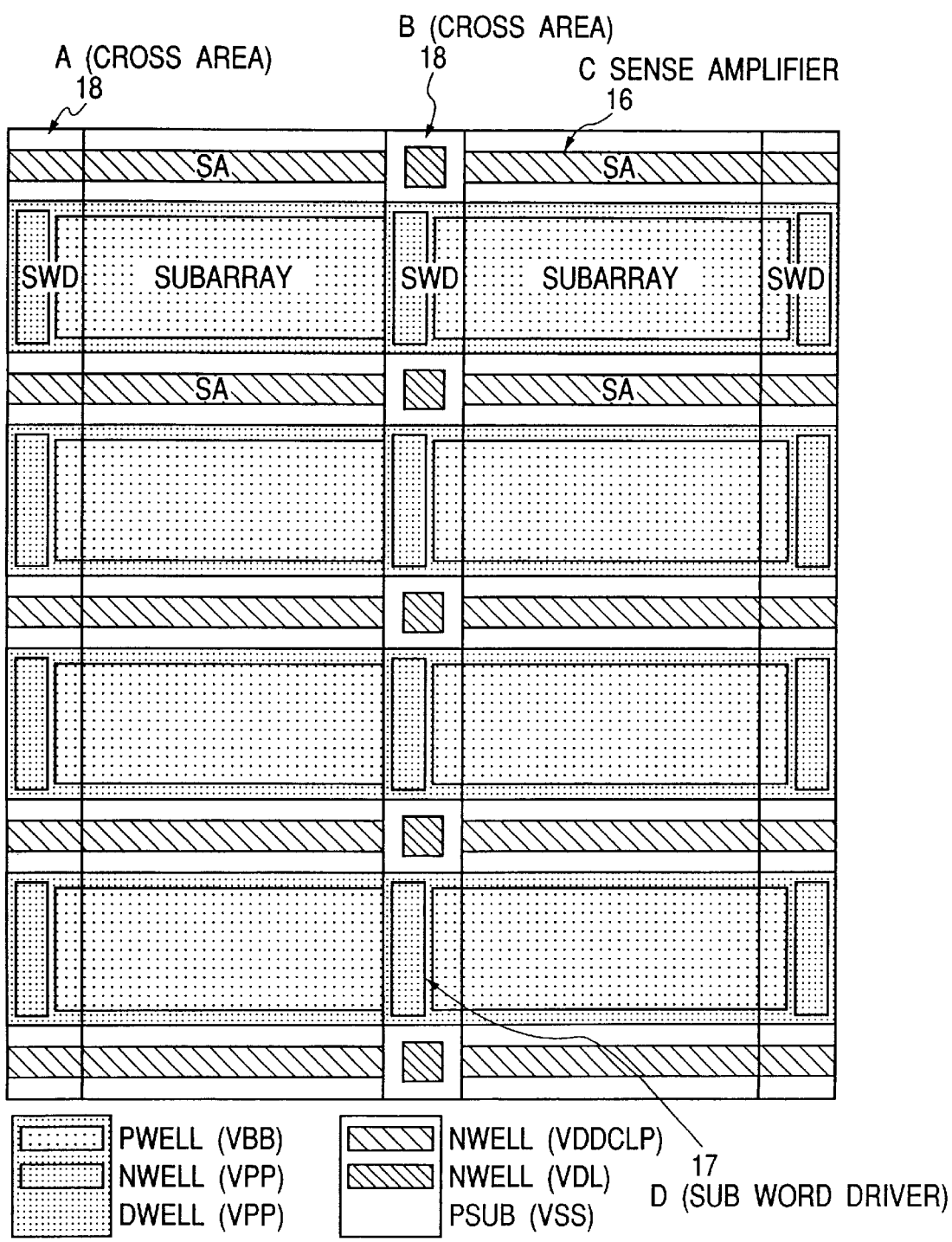
FIG. 10 is a schematic layout diagram of an embodiment of well regions in which the subarrays and peripheral circuits around the same in the dynamic RAM according to the present invention are formed.

FIG. 10 illustrates a schematic layout of an embodiment of well regions in which subarrays and peripheral circuits thereof in the dynamic RAM according to the invention are formed. In FIG. 10, eight subarrays are shown as examples which are enclosed by the dotted line in the memory array in FIG. 8 and include the four subarrays SBARY provided in the shaded position.

In FIG. 10, the white areas represent a P-type substrate (PSUB). The P-type substrate PSUB is provided with the ground potential VSS for the circuits. Two kinds of N-type well regions NWELL (VDL) and NWELL (VDD or VDDCLP) are formed on the P-type substrate PSUB as indicated by oblique lines. Specifically, a clamp voltage VDDCLP or VDD formed utilizing the boosted voltage VPP is supplied to N-type well regions where P-channel type amplifier MOSFETs that constitute the sense amplifiers SA are formed and to N-type well regions where the power switch MOSFETs provided in the rows of cross areas indicated by A are formed.

In the row of cross areas indicated by B, N-type well regions are formed where P-channel type MOSFETs that constitute the switch circuits IOSW provided in association with the sub input/output lines LIO and P-channel type MOSFETs for precharging and equalizing provided at the main input/output lines are formed, and the low voltage VDL is supplied thereto.

A deep N-type well region DWELL is formed to cover the entire area where the subarrays and sub word line driving circuits SWD are formed. The boosted voltage VPP corresponding to the selection level of the word lines is supplied to this deep N-type well region. In this deep N-type well region DWELL, N-type well regions NWELL are formed in which P-channel type MOSFETs that constitute the sub word line driving circuits SWD are formed, and the boosted voltage VPP is applied thereto like the deep N-type well region DWELL.

In the deep N-type well region DWELL, there is formed P-type well regions PWELL for forming N-channel type address selection MOSFETs that constitute the memory cells and N-channel type MOSFETs of the sub word driving circuits SWD. The substrate back bias voltage VBB which is a negative voltage is supplied to those P-type well regions PWELL.

Referring to one of the eight divided arrays shown in FIG. 8, 16 units of subarrays as a whole arranged in the direction of the bit lines are formed in the deep N-type well region DWELL where eight subarrays arranged in the direction of the word lines form one unit, although the present invention is not limited to such an arrangement. The cross areas associated with the sub word drivers provided on both ends of the main word lines extending on the arrays correspond to the rows A and are alternately arranged with the row B as described above. Therefore, common N-channel type well regions NWELL (VDD or VDDCLP) are formed for forming the row A and P-channel type MOSFETs of the two sense amplifiers provided on both sides thereof except at the edge of the chip.

Figure 11:
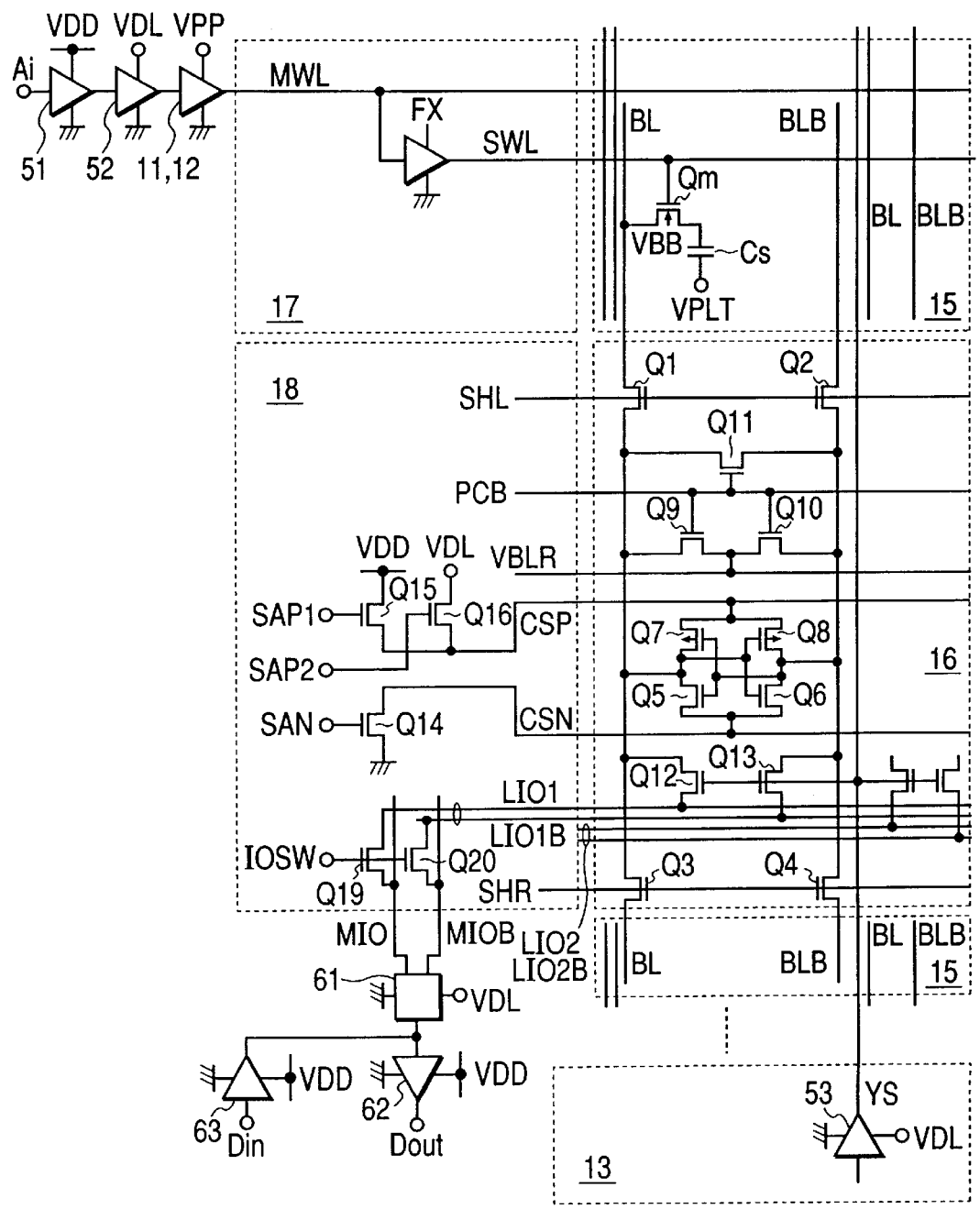
FIG. 11 is a circuit diagram of an embodiment of a dynamic RAM according to the present invention in which the process from address input through data output is simplified primarily in a sense amplifier.

FIG. 11 shows a circuit diagram of a simplified embodiment of processes from address input up to data output illustrated with focus on the sense amplifier portion of a dynamic RAM according to the present invention. FIG. 11 shows a circuit, as an example, provided in the sense amplifier 16 sandwiched by the two subarrays 15 from above and below and the cross area 18, and the rest is shown in the form of a block diagram. The circuit blocks indicated by dotted lines are designated by reference numbers which have appeared above.

One dynamic memory cell is shown as an example which is provided between a sub word line SWL and one of the complementary bit lines BL and BLB (the bit line BL) provided in the one subarray 15. The dynamic memory cell is formed by an address selection MOSFET Qm and a storage capacitor Cs. The gate, drain and source of the address selection MOSFET Qm are connected to the sub word line SWL, bit line BL and storage capacitor Cs, respectively. The other electrode of the storage capacitor Cs is made common and is supplied with the plate voltage VPLT. A negative back bias voltage VBB is applied to the substrate (channel) of the MOSFET Qm. The back bias voltage VBB is set at a value such as −1 V. The selection level of the sub word line SWL is a high voltage VPP which is higher than the high level of the bit line by a value corresponding to the threshold voltage of address selection MOSFET Qm.

When the sense amplifier is adapted to operate on the low voltage VDL, the high level supplied to the bit line after being amplified by the sense amplifier is set at the level of the internal voltage VDL. Therefore, the high voltage VPP associated with the selection level of the word line is VDL+Vth+α. The pair of complementary bit lines BL and BLB of the subarray provided to the left of the sense amplifier are arranged in parallel with each other as illustrated and are appropriately crossed as needed for purposes such as balancing the capacities of the bit lines. Such complementary bit lines BL and BLB are connected to input/output nodes of a unit circuit of the sense amplifier by shared switch MOSFETs Q1 and Q2.

The sense amplifier unit circuit is formed by N-channel type amplifier MOSFETs Q5 and Q6 and P-channel type amplifier MOSFETs Q7 and Q8 which are latched by cross-connecting the gates and drains thereof. The sources of the N-channel type amplifier MOSFETs Q5 and Q6 are connected to a common source line CSN. The sources of the P-channel type MOSFETs Q7 and Q8 are connected to a common source line CSP. A power switch MOSFET is connected to each of the common source lines CSN and CSP. An operating voltage in accordance with the ground potential is supplied to the common source line CSN to which the sources of the N-channel type amplifier MOSFETs Q5 and Q6 are connected by an N-channel type power switch MOSFET Q14 provided in the cross area 18, although the present invention is not limited to such an arrangement.

An N-channel type power MOSFET Q15 for overdriving and an N-channel type power MOSFET Q16 for supplying the internal voltage VDL provided in the cross area 18 are connected to the common source line CSP to which the sources of the P-channel type amplifier MOSFETs Q7 and Q8 are connected, although this is not required by the present invention. The power supply voltage VDD supplied through the external terminal is used as a voltage for overdriving, although this is not requireed by the present invention. Alternatively, in order to reduce the dependence of the sense amplifier operating speed on the power supply voltage VDD, it is possible to use a slightly reduced clamp voltage VDDCLP obtained from the source of an N-channel type MOSFET which is applied with the voltage VPP at the gate and supplied with the power supply voltage VDD at the drain.

An activation signal SAP1 for the overdriving of the sense amplifier supplied to the gate of the N-channel type power MOSFET Q15 is a signal in the same phase as that of an activation signal SAP2 supplied to the gate of the N-channel type MOSFET Q16, and the signals SAP1 and SAP2 are put at a high level in a time sequence. The high level of the signals SAP1 and SAP2 is a signal at the level of the boosted voltage VPP, although this is not required by the present invention. Specifically, since the boosted voltage VPP is about 3.8 V, the N-channel type MOSFET Q15 can be sufficiently turned on. After the MOSFET Q15 is turned off, the MOSFET Q16 is turned on, which allows a voltage in accordance with the internal voltage VDL to be output from the source thereof.

In the sense amplifier driving circuit, the signals SAP1 and SAP2 must be a high voltage in accordance with the level of the voltage VPP and are therefore formed by performing level conversion on timing signals at the level of the voltage VDL formed in the timing circuit. Therefore, the MOSFETS Q15 and Q16 are constituted by MOSFETs having a thick gate insulation film. Meanwhile, the signal at the VDL level is supplied as it is as a timing signal SAN supplied to the gate of the MOSFET Q14 at the ground potential, and the MOSFET Q14 has a thin gate insulation film.

A precharge (equalize) circuit comprising an equalize MOSFET Q11 for shorting the complementary bit lines and switch MOSFETs Q9 and Q10 for supplying a half precharge voltage VBLR to the complementary bit lines is provided at an input/output node of the sense amplifier unit circuit. A precharge signal PCB is commonly supplied to the gates of the MOSFETs Q9 through Q11. The activation of the driver circuit for forming the precharge signal PCB is speeded up by providing inverter circuits in the cross areas, although not shown. The MOSFETs Q9 through Q11 forming the precharge circuit are switched at a high speed through the inverter circuits distributed in the cross areas prior to the timing for selecting word lines when memory access is started.

In addition to the circuits shown in FIG. 11, a half precharge circuit for the common source lines CSP and CSN of the sense amplifier, a half precharge circuit for the local input/output line LIO, distributed driver circuits for shared selection signal lines SHR and SHL and the like are provided as needed in the cross area 18.

The sense amplifier unit circuit is connected to similar complementary bit lines BL and BLB of a subarray 15 in a lower part of FIG. 11 through shared switch MOSFETs Q3 and Q4. Switch MOSFETs Q12 and Q13 form a column switch circuit and are turned on when the selection signal YS becomes the selection level (high level) to connect the input/output node of the sense amplifier unit circuit to local input/output lines LIO1, LIO1B, LIO2, LIO2B and the like. For example, when the sub word line SWL of the upper subarray is selected, the upper shared switch MOSFETs Q1 and Q2 of the sense amplifier are turned on and the lower shared switch MOSFETs Q3 and Q4 are turned off.

As a result, the input/output node of the sense amplifier is connected to the upper complementary bit lines BL and BLB to amplify very small signals on the memory cells connected to the selected sub word line SWL and to transmit them to the local input/output lines LIO1 and LIO1B through the column switch circuit (Q12 and Q13). The local input/output lines LIO1 and LIO1B extend along the row of sense amplifiers, i.e., in the horizontal direction in FIG. 11. The local input/output lines LIO1 and LIO1B are connected to main input/output lines MIO and MIOB to which an input terminal of a main amplifier 61 is connected, through an I/O switch circuit comprising N-channel type MOSFETs Q19 and Q20 provided in the cross area 18. The I/O switch circuit is controlled for switching by a selection signal IOSW and is constituted by a CMOS switch whose P-channel type MOSFET is parallel-connected to each of the N-channel type MOSFETs Q19 and Q20 as will be described later.

The column switch circuit connects two pairs of complementary bit lines BL and BLB to two pairs of local input/output lines LIO1, LIO1B and LIO2, LIO2B with a single selection signal YS, although this is not required by the present invention. Therefore, in a subarray selected as a result of an operation of selecting one main word line, four pairs of complementary bit lines are selected in total by the two pairs of column switch circuits provided in association with the pair of sense amplifiers on both sides of the subarray. In a burst mode, the column selection signal YS is switched to switch the local input/output lines LIO1 and LIO1B and the complementary bit lines BL and BLB of the subarray sequentially.

An address signal Ai is supplied to an address buffer 51. This address buffer operates on a time-division basis to fetch an X-address signal and a Y-address signal. The X-address signal is supplied to a predecoder 52 to form a selection signal for a main word line MWL through a main row decoder 11 and a main word driver 12. The address buffer 51 receives the address signal Ai which is supplied through the external terminal and therefore operates on the power supply voltage VDD supplied through the external terminal; the predecoder 52 operates on the low voltage VDL; and the main word driver 12 operates on the boosted voltage VPP. A column decoder (driver) 53 receives the Y-address signal supplied as a result of the operation of the address buffer 51 on a time-division basis to form the selection signal YS.

A main amplifier 61 operates on the low voltage VDL and provides output from an external terminal Dout through an output buffer 62 operating on the power supply voltage VDD supplied through the external terminal. A write signal input through an external terminal Din is fetched through an input buffer 63 and is supplied to the main input/output lines MIO and MIOB through a write amplifier to be described later which is included in the main amplifier 61 in FIG. 11. In an input portion of the output buffer, there is provided a level shift circuit and a logic portion for outputting an output signal thereof in synchronism with a timing signal associated with the clock signal.

Although not required by the invention, the power supply voltage VDD supplied through the external terminal is 3.3 V; the low voltage VDL supplied to internal circuits is set at 2.0 V; and the selection signal (boosted voltage) for the word lines is 3.8 V. The bit line precharge voltage VBLR is 1.0 V which corresponds to VDL/2, and the plate voltage VPLT is also 1.0 V. The substrate voltage VBB is −1.0 V.

Figure 12:
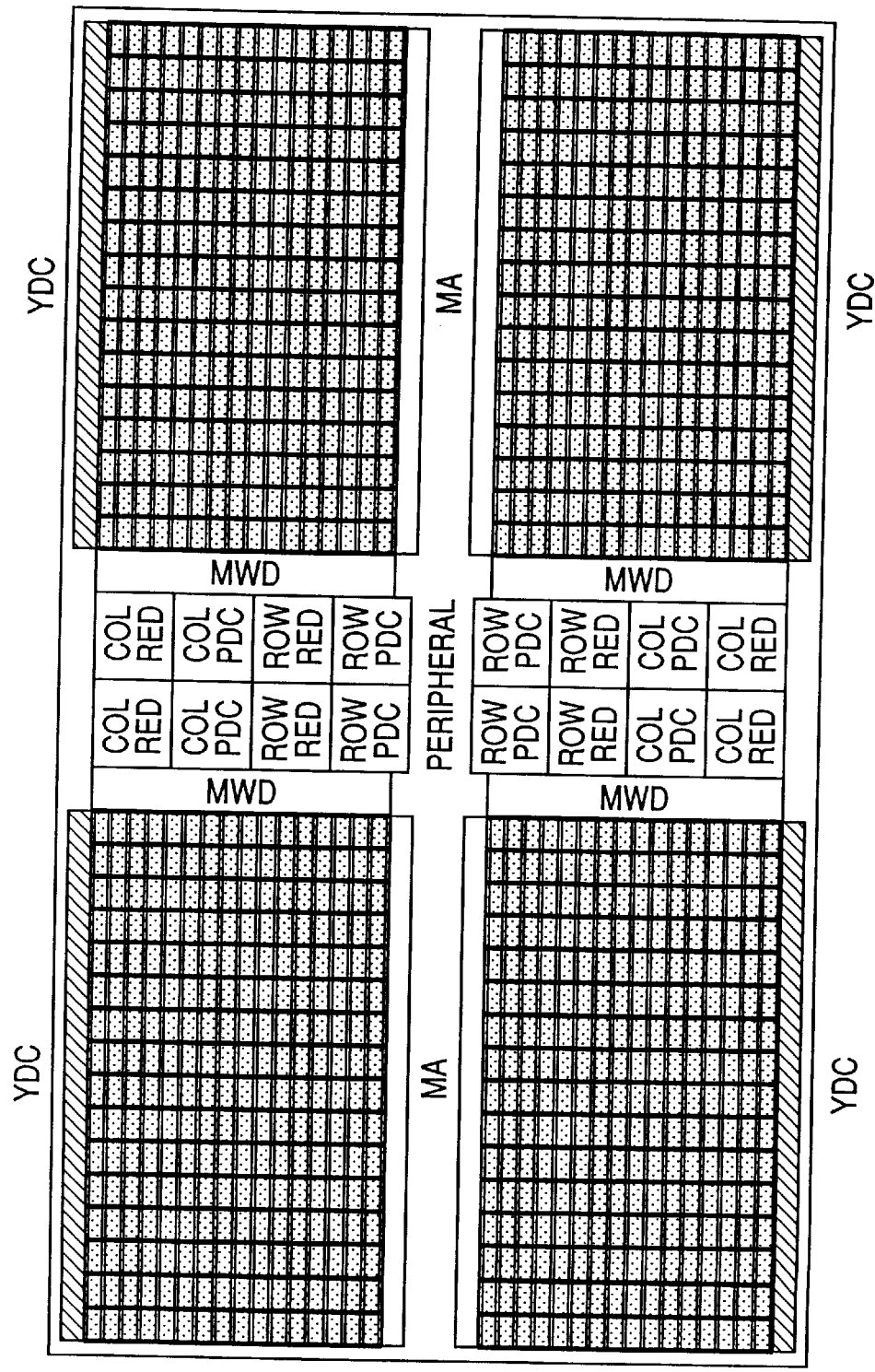
FIG. 12 is a schematic layout diagram of another embodiment of a dynamic RAM according to the present invention.

FIG. 12 illustrates a schematic layout of another embodiment of a dynamic RAM according to the present invention. In the present embodiment, memory arrays as a whole are divided into four parts. Divided memory arrays are provided such that they are viewed as two upper and two lower arrays and two each of left and right arrays in the longitudinal direction of a semiconductor chip. As previously described, there are provided circuits such as an address input circuit, a data input/output circuit and an input/output interface circuit (Peripheral) comprising an array of bonding pads in the central region in the longitudinal direction of the chip. Main amplifiers MA are provided in the middle of the memory arrays.

A predecoder circuit ROWPDC and a relief circuit ROW-RED for the X-system and a predecoder circuit COLPDC and a relief circuit COLRED for the Y-system are provided in a group in the intermediate portion of the horizontal direction with respect to the longitudinal direction in each of the four memory arrays in total which are divided such that they are viewed as two upper and two lower arrays and two each of left and right arrays in the longitudinal direction of a semiconductor chip as described above. That is, two sets of the predecoder circuit ROWPDC and relief circuit ROW-RED for the X-system and the predecoder circuit COLPDC and relief circuit COLRED for the Y-system are provided respectively for the four memory arrays which are provided as two left and two right arrays.

Main word driver regions MWD are similarly formed along the middle portions of the memory arrays such that each of them drives main word lines provided to extend above and under each memory array. In this configuration, when the same subarrays as described above are used, the main word lines extend through 16 subarrays. In the memory arrays, Y-decoders YDC are provided on the chip periphery opposite to the central portion of the chip. In this embodiment, again, each of the four divided memory arrays is sandwiched by the main amplifier MA provided in the middle and the Y-decoder YDC provided on the periphery.

Figure 13:
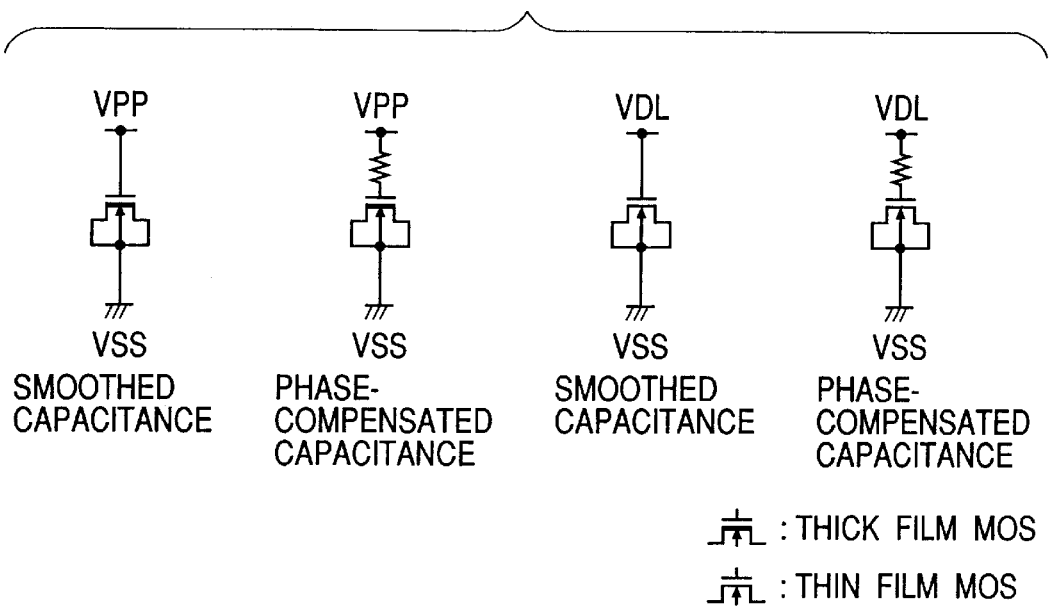
FIG. 13 is a circuit diagram of an embodiment of a capacitor used in the present invention.

FIG. 13 shows a circuit diagram of an embodiment of a capacitor used in the present invention. In the present embodiment, a MOSFET is used as a capacitive element by using the gate electrode as one electrode, the gate insulation film as a dielectric material and the commonly connected source and drain as another electrode. In this case, a MOSFET having a thick gate insulation film is used to provide a smoothed capacitance or phase-compensated capacitance by applying a high voltage like VPP or VDD between the capacitor electrodes, whereas a MOSFET having a thin gate insulation film is used to provide a smoothed capacitance or phase-compensated capacitance by applying only a low voltage like VSL between the capacitor electrodes. This makes it possible to prevent a voltage breakdown of the gate insulation film used as a dielectric material and to provide a high capacitance with a small area by reducing the thickness of the gate insulation film where only a low voltage VDL is applied.

Figure 14A:
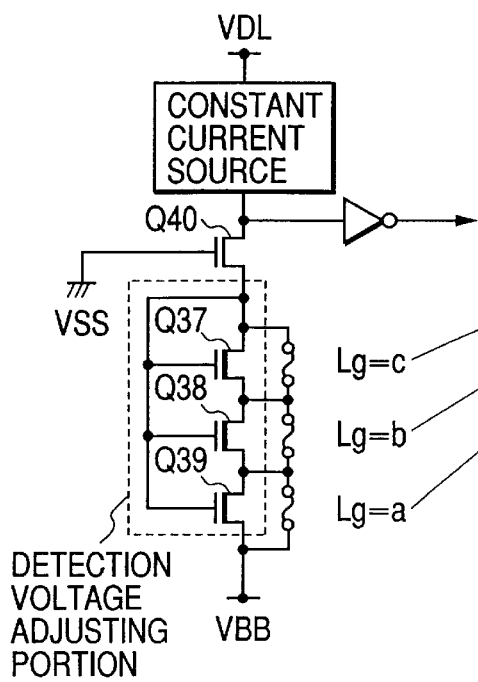
FIGS. 14A and 14B are a circuit diagram and a graph, respectively, for an embodiment of a voltage detection circuit provided in a substrate voltage generation circuit in a dynamic RAM according to the present invention.
Figure 14B:
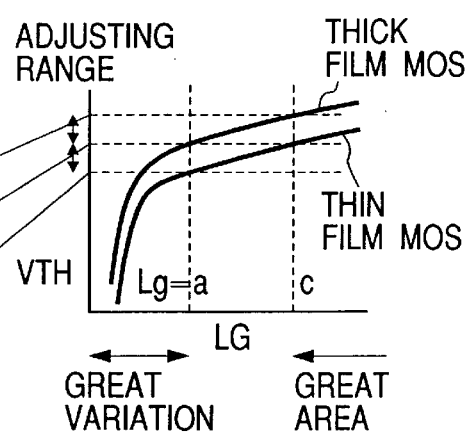

FIGS. 14A and 14B illustrate a configuration of an embodiment of a voltage detection circuit provided in a substrate voltage generation circuit. As shown in the circuit diagram in FIG. 14A, a constant current source is provided at the drain of a MOSFET Q40 having a thin gate insulation film, and the ground potential of the circuit is supplied to the gate. Series-connected MOSFETs Q37, Q38 and Q39 are provided between the source of the MOSFET Q40 and a substrate voltage VBB, and the gate of each MOSFETs is connected to the source of the MOSFET Q40. Each MOSFET is shorted by providing a fuse between the drain and source thereof.

Among the MOSFETs Q37 through Q39, the MOSFETs Q37 and Q38 have a thick gate insulation film and the MOSFET Q39 has a thin gate insulation film. As apparent from the characteristics diagram in FIG. 14B showing the relationship between the gate length and threshold voltage VTH, the threshold voltage VTH is set in three ways, i.e., the gate length LG is made relatively large to use a region where the variation of the threshold voltage VTH is small; a small gate length LG=a is formed for the MOSFETs Q38 and Q39 is made at a small value "a"; or a large gate length LG=c is formed for the MOSFET Q37.

The fuses are selectively cut off to select a combination of the MOSFETs Q37 through Q39 such that the drain voltage of the MOSFET Q40 becomes equal to or lower than a logic threshold voltage of an inverter circuit when the substrate voltage VBB becomes −1 V in relation to the threshold voltage of the MOSFET Q40. The use of such a detection voltage adjusting portion makes it possible to set the substrate voltage VBB with process-related variation of the MOSFETs compensated. Specifically, when a reduction in the drain voltage of the MOSFET Q40 puts a signal output through the inverter circuit at a high level, the operation of a charge pump circuit for generating the substrate voltage VBB is stopped. When the absolute value of the substrate voltage VBB is reduced by a leakage current or the like to reduce the back bias, the drain voltage of the MOSFET Q40 increases to put the signal output through the inverter circuit at a low level, which causes the operation of the charge pump circuit for generating the substrate voltage VBB to be resumed. Such an intermittent operation of the charge pump circuit makes it possible to keep the substrate voltage VBB at a constant voltage such as −1 V.

According to the present invention, contradictory technical objects, i.e., maintaining the information retention characteristics of memory cells as described above and the withstand voltage of MOSFETs during burn-in, reduction of an internal voltage to reduce power consumption and maintaining an operating speed, are achieved by configuring circuits utilizing two kinds of gate insulation films adapted to respective operating voltages, providing three threshold voltages through combinations of the two kinds of MOSFET gate insulation film thickness and gate lengths Lg, expanding the adjusting range of a voltage detection circuit, i.e., expanding the range of compensation of process-related variation of the substrate voltage and by allowing accurate voltage setting.

Figure 15:
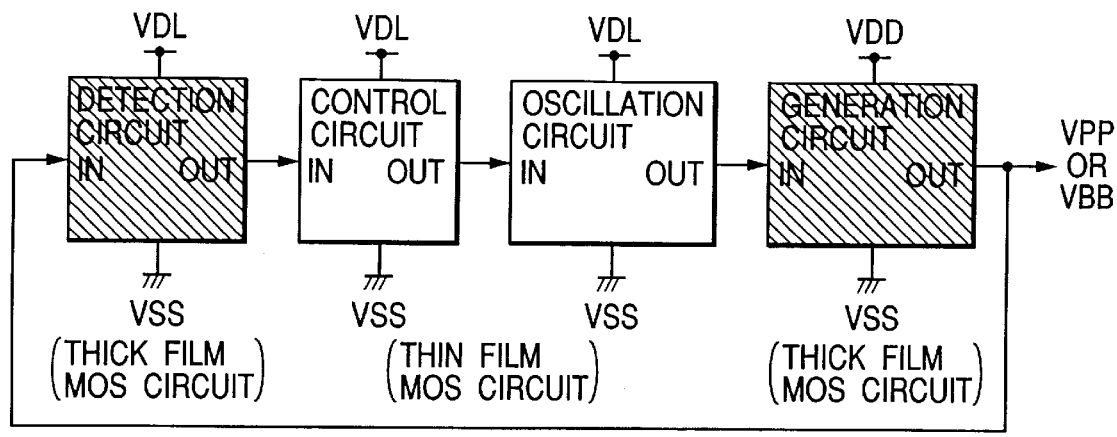
FIG. 15 is a block diagram of an embodiment of an internal voltage generation circuit provided in a dynamic RAM according to the present invention.

FIG. 15 shows a block diagram of an embodiment of an internal voltage generation circuit. The voltage argeneration circuit of the present embodiment forms a boosted voltage VPP or a negative voltage VBB using a charge pump circuit. The voltage generation circuit comprises a detection circuit for comparing the voltage VPP or VBB with a desired set voltage, a control circuit for forming a control signal in response to a detection signal therefrom, an oscillation circuit whose operation is controlled by the control circuit, and a generation circuit constituted by a charge pump circuit for generating the boosted voltage VPP or substrate voltage VBB in response to an oscillation signal from the oscillation circuit.

Among the above-described circuit blocks, the detection circuit and generation circuit with oblique lines are constituted by a thick film MOSFET, and the control circuit and oscillation circuit operating on a low voltage VDL are constituted by a thin film MOSFET. Although a thin film MOSFET is to be essentially used for the detection circuit whose operating voltage is the low voltage VDL, a thick film MOSFET is used instead in order to provide a wide or accurate adjusting range as described above. A thick film MOSFET is inevitably used for the detection circuit for the voltage VPP.

Figure 16A:
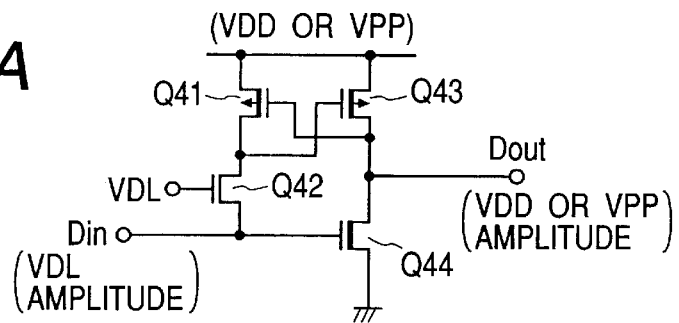
FIGS. 16A and 16B are circuit diagrams of an embodiment of a level shift circuit used in the present invention.
Figure 16B:
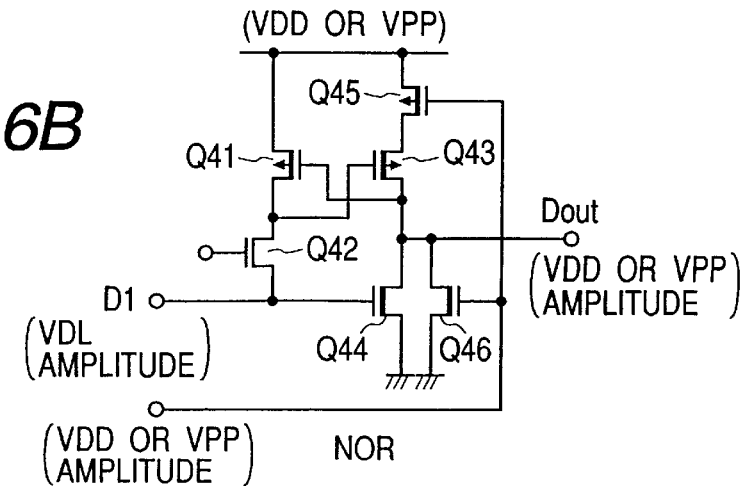

FIGS. 16A and 16B show circuit diagrams of an embodiment of a level shift circuit used in the present invention. Referring to FIG. 16A, an input signal Din having a low amplitude associated with the low voltage VDL is connected to the gate of an N-channel type MOSFET Q44 and the source of an N-channel type MOSFET Q42. The low voltage VDL is supplied to the gate of the MOSFET Q42. P-channel type MOSFETs Q41 and Q43 whose gates and drains are cross-connected to each other are provided between the drains of the pair of MOSFETS Q42 and Q44 and the power supply voltage VDD (or VPP).

This circuit operates as follows. When the input signal Din is at a high level (VDL), the N-channel type MOSFET Q 42 is turned off, and the N-channel type MOSFET Q44 is turned on. When the MOSFET Q44 is turned on, an output signal Dout changes to a low level to turn on the MOSFET Q41. When the MOSFET Q41 is turned on, the MOSFET Q43 is turned off because the gate of the MOSFET Q43 is at the voltage VDD (or VPP). When the input signal Din is at a low level (0V), the N-channel type MOSFET Q42 is turned on, and the N-channel type MOSFET Q44 is turned off. When the MOSFET Q42 is turned on, the low level of the input signal Din is transmitted to the gate of the P-channel type MOSFET Q43 to turn on the same. When the MOSFET Q43 is turned on, the MOSFET Q41 is turned off because the voltage VDD (or VPP) is developed at the gate thereof, and the output signal Dout is changed to a high level such as the voltage VDD (or VPP).

Referring to FIG. 16B, an input signal D1 associated with the low voltage VDL is connected to the gate of the N-channel type MOSFET Q44 and the source of the N-channel type MOSFET Q42 as described above. The low voltage VDL is supplied to the gate of the MOSFET Q42. P-channel type MOSFETS Q41 and Q43 whose gates and drains are cross-connected to each other are provided between the drains of the pair of MOSFETs Q42 and Q44 and the power supply voltage VDD (or VPP).

For example, in order to provide nor (NOR) logic, an N-channel type MOSFET Q46 is provided in parallel with the N-channel type MOSFET Q44 whose drain is connected to an output terminal Dout, and a P-channel type MOSFET Q45 is provided in series with the P-channel type MOSFET Q43 whose drain is connected to the output terminal Dout. A timing signal D2 in accordance with the power supply voltage VDD (or VPP) is supplied to the gates of the N-channel type MOSFET Q46 and P-channel type MOSFET Q45. The MOSFETs Q45 and Q43 may be connected in inverted positions.

This circuit operates as follows. When the low-amplitude signal D1 is at a low level (0 V), the N-channel type MOSFET Q42 and the N-channel type MOSFET Q44 are on and off, respectively. Therefore, when the timing signal D2 is at a high level, the N-channel type MOSFET Q46 which is turned on by the high level of the timing signal D2 puts the output terminal Dout at a low level such as the ground potential VSS of the circuit regardless of a latching operation of the P-channel type MOSFETs Q41 and Q43.

A transition of the timing signal D2 from the high level to the low level turns the P-channel type MOSFET Q45 and the N-channel type MOSFET Q46 on and off, respectively. Therefore, when the signal D1 is at the low level, the N-channel type MOSFET Q42 is turned on to supply the low level of the signal D1 to the gate of the P-channel type MOSFET Q43, thereby turning on the same. As a result, the output terminal Dout is changed from the low level to the high level by the MOSFETs Q45 and Q43 which have been turned on. When the signal D1 is at the high level, since the N-channel type MOSFET Q42 and the N-channel type MOSFET Q44 are turned off and on respectively, the output terminal Dout continues to output a low level such as the ground potential VSS. Thus, the circuit shown in FIG. 16B can carry out both a logical operation on the low-amplitude signal D1 and the high-amplitude signal D2 and a level converting operation thereon.

Figure 17A:
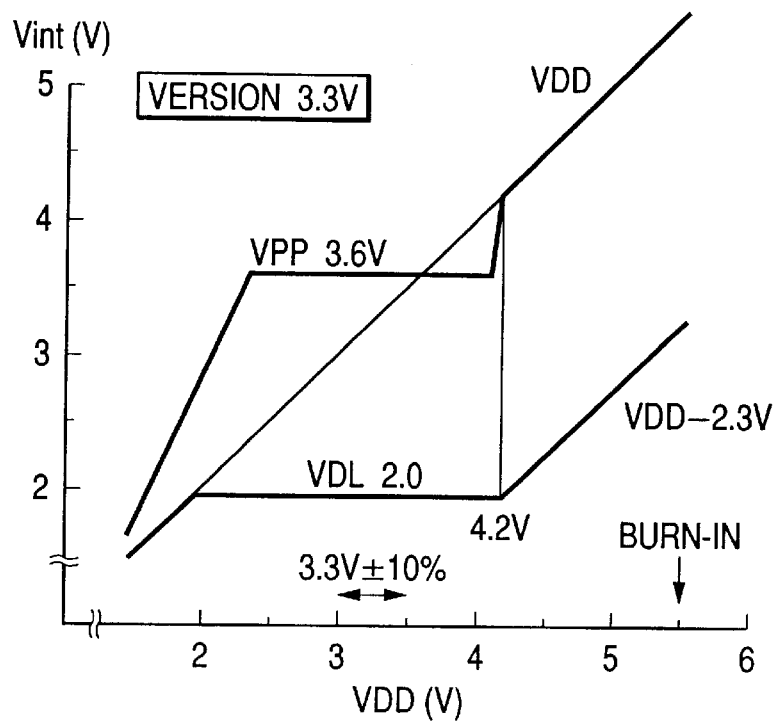
FIGS. 17A and 17B are voltage characteristic diagrams of an example of an internal voltage circuit of a dynamic RAM according to the present invention.
Figure 17B:
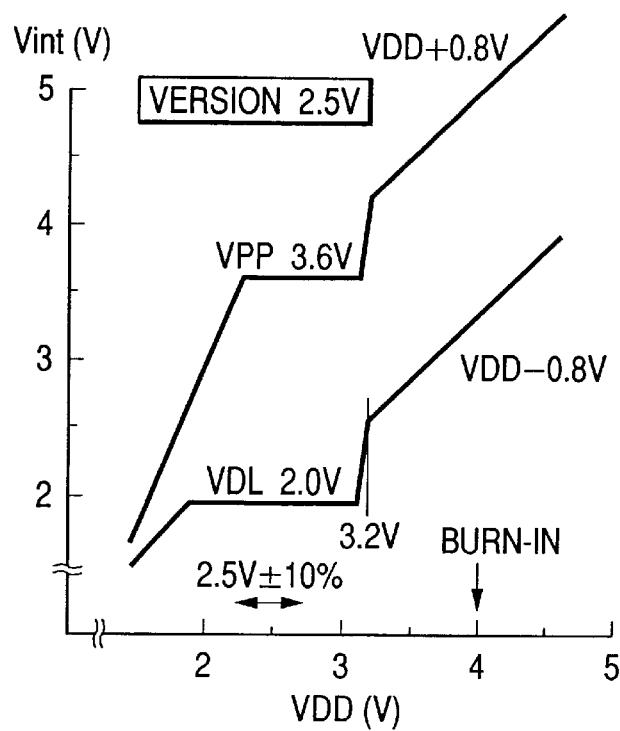

FIGS. 17A and 17B show diagrams for voltage characteristics of the internal voltage circuit. Each of the low voltage circuit and boosting circuit forms a substantially constant voltage within an allowable range of variation of the external voltage VDD. Specifically, the voltages VPP and VDL are respectively stabilized at 3.6 V and 2.0 V in the 3.3 V version. The voltages VPP and VDL are respectively stabilized at 3.6 V and 2 V also in the 2.5 V version, although this is not a requirement of the present invention. The voltage VDL may be reduced further to a lower voltage such as 1.8 V.

In the 3.3 V version, a circuit for detecting the power supply voltage VDD is provided; the operation of boosting the voltage VPP is stopped at a power supply voltage equal to or higher than 4.2 V to output the power supply voltage VDD as it is; the low voltage VDL changes to follow up the voltage VDD to reduce the voltage VDD to −2.3 V; and the voltage VPP is increased to 5.5 V in accordance with the voltage VDD during a burn-in test in which the power supply voltage VDD is set at 5.5 V. However, since the low voltage VDL stays at a low value such as 3.2 V, no insulation breakdown occurs even on a gate insulation film as thin as about 4 nm as described above.

In the 2.5 V version, a circuit for detecting the power supply voltage VDD is provided like the above; at a high power supply voltage of 3.2 V or more, the voltage VPP causes the voltage VDD to be output at +0.8 V; the low voltage VDL changes to follow up the voltage VDD to reduce the voltage VDD to −0.8 V; and the voltage VPP is increased to 4.8 V in accordance with the voltage VDD during a burn-in test in which the power supply voltage VDD is set at 4.0 V. However, since the low voltage VDL again stays at a low value such as 3.2 V, no insulation breakdown occurs even on a gate insulation film as thin as about 4 nm as described above.

Actions and advantages achieved by the above-described embodiments are as follows.

(1) In a semiconductor integrated circuit in which an internal voltage generation circuit operating on a power supply voltage supplied through an external terminal forms a low voltage and a boosted voltage as needed to operate internal circuits, a first internal circuit operating on the power supply voltage supplied through the external terminal or the boosted voltage formed by the internal voltage generation circuit is constituted by a first MOSFET with a gate insulation film having a large thickness adapted to the power supply voltage or boosted voltage, and a second internal circuit operating on the low voltage is constituted by a second MOSFET with a gate insulation film having a small thickness adapted to the low voltage. As a result, an advantage is provided in that a device can be made finer, faster and less power-consuming without reducing reliability.

(2) The boosted voltage increases depending on a the power supply voltage when the power supply voltage is equal to or higher than a predetermined voltage and comprises a power supply voltage and a boosted voltage during a burn-in test which is set at a power supply voltage equal to or higher than a predetermined voltage or at a boosted voltage. The low voltage increases depending on a power supply voltage when the power supply voltage is equal to or higher than a predetermined voltage and comprises a low voltage during a burn-in test which is set at the power supply voltage equal to or higher than the predetermined voltage. This provides an advantage in that a semiconductor integrated circuit device having high reliability can be provided.

(3) MOSFETs having a thick gate insulation film are used for an input circuit for receiving an input signal supplied through an external terminal, an output circuit for transmitting an output signal to the external terminal, the internal voltage generation circuit and an internal circuit operating on a boosted voltage formed by the internal voltage generation circuit. This is advantageous in that the withstand voltage of a device in environments including a burn-in test can be maintained while achieving an interface with the outside.

(4) A delay circuit, in which a MOSFET having a thick gate insulation film as described above plays a dominant roll, is used for forming a timing signal for the operation of an internal circuit operating on the low voltage which is operated by a low voltage in association with the operation timing signal for an internal circuit operating on the power supply voltage or boosted voltage. This makes it possible to set a timing which will accommodate process-related variations of MOSFETs having a thick gate insulation film, thereby allowing a time margin to be set at the minimum. This results in an advantage in that a high speed can be maintained using two MOSFETs having two kinds of gate insulation films.

(5) A boosted voltage is used to operate a dynamic memory cell comprising an address selection MOSFET constituting a dynamic RAM and a storage capacitor and a word driver for forming a selection signal for word lines to which such a dynamic memory cell is connected, and a power supply voltage is used to operate an input circuit for inputting control input signals including an address signal and a clock signal provided as needed and inputting a write input signal and an output circuit for outputting a readout signal read out from the memory cell. This is advantageous in that an input/output interface with external devices can be provided while maintaining the information retention time of the memory cell.

(6) A negative back bias voltage is supplied to a semiconductor region where the address selection MOSFET of the memory cell is formed, and such a back bias voltage is formed by the internal voltage generation circuit. This is advantageous in that the threshold voltage of the address selection MOSFET can be increased further and in that information retention characteristics can be improved.

(7) An operation timing signal delayed by the delay circuit in which a MOSFET having a thick gate insulation film plays a dominant roll is used as the operation timing signal of the word driver. This makes it possible to set the operation timing of a sense amplifier in accordance with a readout signal read out on to bit lines from a memory cell, thereby providing an advantage in that high speed memory access can be achieved.

(8) The operation timing signal of the sense amplifier is delayed by a delay signal from a delay circuit constituted by a second MOSFET having a thin gate insulation film adapted to the sense amplifier to set an operating time of an N-channel type MOSFET for overdriving for supplying the power supply voltage to the source of a P-channel type MOSFET that constitutes a sense amplifier adapted to the power supply voltage or boosted voltage, and a driving N-channel type MOSFET is driven to supply the low voltage to the source of the P-channel type MOSFET that constitutes the sense amplifier after such an operating time. This is advantageous in that the overdriving can be carried out for a period of time in accordance with the operation of the sense amplifier.

(9) The delay circuit, in which a MOSFET having a thick gate insulation film plays a dominant roll, comprises an inverter circuit constituted by the MOSFET having a thick gate insulation film to which an input signal to be delayed is supplied at an input terminal, resistive means for transmitting an output signal from the inverter circuit, a capacitor to which the signal is transmitted through the resistive means and which is formed utilizing the gate capacitance of the second MOSFET and one or two inverter circuits which are constituted by the second MOSFET and to which an output signal from a time constant circuit formed by the resistor and capacitor is supplied at an input terminal thereof to form the delay signal. This is advantageous in that a relatively long delay time can be defined with a small number of elements and a low power consumption.

(10) An internal circuit operating on the power supply voltage or the boosted voltage formed by the internal voltage generation circuit includes a smoothing MOS capacitance and a capacitance for phase Ad compensation to which such a voltage is applied at the gate thereof, and a second internal circuit operating on the low voltage formed by the internal voltage generation circuit includes a smoothing MOS capacitance and a capacitance for phase compensation to which such a voltage is applied to the gate thereof. Selective use of them provides an advantage in that the withstand voltage can be maintained and in that a large capacitance can be achieved with a small size.

(11) The internal voltage generation circuit includes a substrate voltage generation circuit having a fourth N-channel type MOSFET constituted by a MOSFET with a thin gate insulation film as described above in which a constant current source is provided at the drain thereof; the gate is connected to the ground potential of the circuit; and a detection voltage adjusting portion is provided between the source and a substrate voltage and having a voltage detection circuit constituted by an inverter circuit for forming a detection signal in response to an output from the drain of the fourth MOSFET for setting the substrate voltage at a desired voltage. The detection voltage adjusting portion is formed by fifth, sixth and seventh N-channel type MOSFETs whose gates are connected to the source of the fourth N-channel type MOSFET and whose drain and source paths are series-connected and fuse means for shorting the drains and sources of them. The fifth and sixth N-channel type MOSFETs are formed with a thick gate insulation film, and the seventh N-channel type MOSFET is formed with a thin gate insulation film. The gate lengths of the MOSFETs are set to provide different threshold voltages within a range of gate length in which the variation of the threshold voltages is small taking the relationship between the gate length and threshold voltage of each MOSFET into consideration. The fuses are selectively cut off to adjust the detection voltage. This makes it possible to provide an advantage in that the range for compensation of process-related variation of the MOSFETs can be expanded and in that the VBB voltage can be set with high accuracy.

(12) There is provided a dynamic RAM comprising subarrays having sub word lines whose length is divided in the direction in which the main word lines extend, a plurality of which are arranged in the direction of the bit lines crossing the main word lines and to which address selection terminals of a plurality of dynamic memory cells are connected and having a plurality of complementary bit lines which are provided perpendicular to the plurality of sub word lines and to which input/output terminals of the dynamic memory cells are connected, a plurality of sub word line driving circuits for forming a selection signal for the sub word lines in response to a selection signal for the main word lines and a selection signal transmitted through the sub word selection lines, and a main word line driving circuit for forming a selection signal for the main word lines. There is an advantage in that a large storage capacity and a high speed can be achieved.

(13) In the dynamic RAM, separate sub word line driving circuits as described above are provided on both sides of the array of a plurality of sub word lines associated with the subarrays; separate sense amplifiers are provided on both sides of the array of a plurality of complementary bit lines; and one of the subarrays is formed such that it is surrounded by the row of a plurality of sub word line driving circuits and the row of a plurality of sense amplifiers. This is advantageous in that a large storage capacity and a high speed can be achieved.

(14) The sense amplifiers are based on a shared sense system and are provided in association with the bit lines of subarrays adjacent thereto to select the sub word lines of the subarrays adjacent to the sub word line driving circuit. This is advantageous in that a large storage capacity and a high speed can be achieved.

(15) The low voltage is set at a voltage which is substantially equal to or lower than 2V and which is higher than the lower limit of the operating voltage of a CMOS circuit constituted by a MOSFET having a thin gate insulation film. This provides an advantage in that the operating speed can be maintained with reduced power consumption.

(16) There is provided a low voltage circuit for receiving a power supply voltage supplied by an external terminal and for generating a low voltage obtained by decreasing the same, a first internal circuit operating on a voltage higher than the low voltage and a second internal circuit operating on the low voltage. The first internal circuit is basically constituted by a first MOSFET with a gate insulation film having a first thickness, and the second internal circuit is basically constituted by a second MOSFET with a gate insulation film having a second thickness which is smaller than the first thickness. In the second internal circuit, a delay circuit for forming a timing signal for the first internal circuit is configured using the first MOSFET. This is advantageous in that a time margin determined taking process-related variation into consideration can be set at a minimum value.

Although the present invention made by the inventors has been specifically described with reference to varions embodiments thereof, the present invention is not limited to the above-described embodiments and may obviously be modified within the range of the principle thereof. For example, the configuration of the subarrays in a dynamic RAM and the arrangement of a plurality of memory arrays loaded on a semiconductor chip may be embodied in various modes depending on the storage capacity thereof and the like. Various modes of implementation are possible for the configuration of the sub word driver. The area of the input/output interface may be a synchronous or run bus type dynamic RAM in which read and write operations are performed in accordance with a clock signal. The dynamic RAM may be combined with a logic circuit such as a CMOS circuit into a single semiconductor integrated circuit device. Any circuit other than the memory cells and selection circuits therefor may be operated by the boosted voltage.

The present invention may be widely applied to semiconductor integrated circuit devices including internal circuits operating on a power supply voltage supplied through an external terminal or a voltage obtained by boosting the same and internal circuits operating on a voltage obtained by reducing the power supply voltage. In this case, the thickness of a gate insulation film may be determined by a withstand voltage which takes the voltage of a burn-in test as described above into account and specific requirements on the circuit depending on the operating voltage of the same.

Advantages achieved by typical aspects of the invention disclosed in this specification can be briefly described as follows. In a semiconductor integrated circuit device in which an internal voltage generation circuit operating on a power supply voltage supplied through an external terminal forms a low voltage and a boosted voltage as needed to operate internal circuits, a first internal circuit operating on the power supply voltage supplied through the external terminal or the boosted voltage formed by the internal voltage generation circuit is constituted by a first MOSFET with a gate insulation film having a large thickness adapted to the power supply voltage or boosted voltage, and a second internal circuit operating on the low voltage is constituted by a second MOSFET with a gate insulation film having a small thickness adapted to the low voltage. As a result, an advantage is provided in that a device can be made finer faster with less power-consumption without reducing reliability.

When the second internal circuit is operated in association with the operation of the first internal circuit, a timing signal for the operation of the second internal circuit is formed by a delay circuit in which the first MOSFET forming the first internal circuit plays a dominant roll with the state of operation of the first internal being monitored. This is advantageous in that a time margin determined taking process-related variation into consideration can be set at a minimum value.

What is claimed is:

1. A semiconductor integrated circuit comprising:
   an external terminal which receives an external power supply voltage;
   an internal voltage generation circuit which generates either or both of a low voltage lower than said external power supply voltage and a high voltage higher than said external power supply voltage;
   a first internal circuit operating on said external power supply voltage or said high voltage; and
   a second internal circuit operating on said low voltage,
   wherein said first internal circuit comprises a first MOSFET with a gate insulation film having a large thickness adapted to said external power supply voltage or high voltage,
   wherein said second internal circuit comprises a second MOSFET with a gate insulation film having a small thickness adapted to said low voltage,
   wherein said first internal circuit comprises a third internal circuit operating on said high voltage,
   wherein said second internal circuit comprises a fourth internal circuit operated in association with the operation of said third internal circuit, and
   wherein said fourth internal circuit is operated by an operation timing signal which is delayed from the operation timing signal of said third internal circuit by a first delay circuit including a MOSFET having a gate insulation film having said large thickness.

2. A semiconductor integrated circuit device comprising:
   an external terminal which receives an external power supply voltage;
   an internal voltage generation circuit which generates either or both of a low voltage lower than said external power supply voltage and a high voltage higher than said external power supply voltage;
   a first internal circuit operating on said external power supply voltage or said high voltage; and
   a second internal circuit operating on said low voltage,
   wherein said first internal circuit comprises a first MOSFET with a gate insulation film having a large thickness adapted to said external power supply voltage or high voltage, wherein said second internal circuit comprises a second MOSFET with a gate insulation film having a small thickness adapted to said low voltage, and wherein said high voltage increases depending said external power supply voltage when it is equal to or higher than a predetermined voltage and wherein said low voltage increases depending on said external, power supply voltage when it is equal to or higher than a predetermined voltage.

3. A semiconductor integrated circuit device according to claim 1, wherein said first internal circuit comprised an input circuit which receives an input signal supplied through an external terminal and an output circuit which transmits an output signal to the external terminal.

4. A semiconductor integrated circuit device according to claim 3, wherein said third internal circuit comprises a dynamic memory cell formed by an address selection MOSFET and a storage capacitor and a word driver which forms a selection signal for word lines to which such a dynamic-memory cell is connected;

said input circuit receives an address signal; and said output circuit outputs a readout signal read out from said memory cell.

5. A semiconductor integrated circuit device according to claim 4, wherein a negative back bias voltage is supplied to a semiconductor region where the address selection MOSFET of said memory cell is formed and wherein such a back bias voltage is formed by said internal voltage generation circuit.

6. A semiconductor integrated circuit device according to claim 4, wherein said fourth internal circuit comprises a driving circuit which drives a sense amplifier and wherein said driving circuit is operated by an operation timing signal which is obtained by delaying the operation timing signal of said word driver with first delay circuit including said first MOSFET.

7. A semiconductor integrated circuit device according to claim 6, wherein said driving circuit comprises:

a first N-channel type MOSFET for overdriving for supplying the power supply voltage to the source of a P-channel type MOSFET that constitutes a sense amplifier;

a second N-channel type MOSFET for driving which supplies said low voltage to the source of a P-channel type MOSFET that constitutes said sense amplifier; and a third N-channel type MOSFET for driving which supplies a ground potential of a circuit to the source of an N-channel type MOSFET that constitutes said sense amplifier, wherein said first and second N-channel type MOSFETs comprise said first MOSFET having a thick gate insulation film and said third N-channel type MOSFET comprises said second MOSFET having a thin gate insulation film.

8. A semiconductor integrated circuit device according to claim 1 or 7, wherein said first delay circuit comprises:

an inverter circuit having said first MOSFET to which an input signal to be delayed is supplied at an input terminal thereof;

resistor which transmits an output signal of said inverter circuit;

a capacitor to which the signal is transmitted through said resistor and which is formed utilizing the gate capacitance of said second MOSFET; and an inverter circuit having said second MOSFET to which an output signal of a time constant circuit formed by said resistor and capacitor is supplied at an input terminal thereof to form said delay signal.

9. A semiconductor integrated circuit device according to claim 1, wherein said first internal circuit operating on said external power supply voltage or said high voltage includes either or both of a smoothing MOS capacitance and a capacitance for phase compensation to which such a voltage is applied at the gate thereof and wherein said second internal circuit operating on said low voltage includes either or both of a smoothing MOS capacitance and a capacitance for phase compensation to which such a voltage is applied to the gate thereof.

10. A semiconductor integrated circuit device according to claim 5, wherein said internal voltage generation circuit comprises a substrate back bias voltage generation circuit;

such a substrate back bias voltage generation circuit comprising a voltage detection circuit for setting a substrate voltage at a desired voltage;

said voltage detection circuit comprises a fourth N-channel type MOSFET constituted by said second MOSFET having a current source provided at the drain thereof, a gate connected to the ground potential of a circuit and a detection voltage adjusting portion provided between the source and a substrate voltage and comprises an inverter circuit for forming a detection signal in response to an output from the drain of said fourth MOSFET;

said detection voltage adjusting portion comprises fifth, sixth and seventh N-channel type MOSFETs provided between the source of said fourth N-channel type MOSFET and the substrate voltage whose gates are connected to the source of said fourth N-channel type MOSFET and whose drain and source paths are series-connected and fuse means for shorting the drains and source of them;

said fifth and sixth N-channel type MOSFETs comprise said first MOSFET having a thick gate insulation film and said seventh N-channel type MOSFET comprises said second MOSFET having a thin gate insulation film, the gate lengths thereof being set to provide different threshold voltages; and said fuses are selectively cut off to adjust said detection voltage.

11. A semiconductor integrated circuit device according to claim 4, wherein said third internal circuit comprises:

main word lines;

subarrays having sub word lines whose length is divided in the direction in which said main word lines extend, which are arranged in plurality in the direction of the bit lines crossing said main word lines and to which address selection terminals of a plurality of dynamic memory cells are connected and having a plurality of complementary bit lines which are provided perpendicular to said plurality of sub word lines and to one of which input/output terminals of said dynamic memory cells are connected;

a plurality of sub word line driving circuit which forms a selection signal for said sub word lines in response to a selection signal for said main word lines and a selection signal transmitted through said sub word selection lines; and a main word line driving circuit which forms a selection signal for said main word lines.

12. A semiconductor integrated circuit device according to claim 11, wherein in said subarrays, said sub word line driving circuits are separated and provided on both sides of said array of a plurality of sub word lines associated with the subarrays;

sense amplifiers are separated and provided on both sides of said array of a plurality of complementary bit lines; and one of said subarrays is formed such that it is surrounded by said row of a plurality of sub word line driving circuits and said row of a plurality of sense amplifiers.

13. A semiconductor integrated circuit device according to claim 12, wherein said sense amplifiers are based on a shared sense system and are commonly provided in association with the bit lines of subarrays adjacent thereto; and said sub word line driving circuit selects the sub word lines of the subarrays adjacent thereto.

14. A semiconductor integrated circuit device according to claim 1 or 4, wherein said low voltage is a voltage which is substantially equal to or lower than 2 V and which is higher than the lower limit of the operating voltage of a CMOS circuit having the second MOSFET.

15. A semiconductor integrated circuit device comprising:

a low voltage circuit which receives a first voltage and which generates a second voltage obtained by reducing the same;

a first internal circuit operating on a voltage higher than said second voltage; and a second internal circuit operating on said second voltage, wherein said first internal circuit is comprised of a first MOSFET with a gate insulation film having a first thickness;

wherein said second internal circuit is comprised of a second MOSFET with a gate insulation film having a second thickness which is smaller than said first thickness;

wherein said second internal circuit also comprises a delay circuit which forms a timing signal for said first internal circuit; and wherein said delay circuit is comprised of a MOSFET having a gate insulation film having said first thickness.

16. A semiconductor integrated circuit device according to claim 15, further comprising word lines;

data lines;

sense amplifiers connected to said data lines;

a word line driving circuit; and a sense amplifier driving circuit, wherein said first internal circuit comprises said word line driving circuit;

said second internal circuit comprises said sense amplifier driving circuit; and said delay circuit forms an operation timing signal for said sense amplifier driving circuit which is a signal obtained by delaying the operation timing signal of said word line driving circuit.

* * * * *